United States Patent
Mazumder et al.

(10) Patent No.: US 12,265,485 B2
(45) Date of Patent: *Apr. 1, 2025

(54) APPARATUS INCLUDING PARALLEL PIPELINES AND METHODS OF MANUFACTURING THE SAME

(71) Applicant: Micron Technology, Inc., Boise, ID (US)

(72) Inventors: Kallol Mazumder, Dallas, TX (US); Navya Sri Sreeram, Plano, TX (US); Ryo Fujimaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 112 days.

This patent is subject to a terminal disclaimer.

(21) Appl. No.: 17/979,679

(22) Filed: Nov. 2, 2022

(65) Prior Publication Data

US 2023/0060064 A1 Feb. 23, 2023

Related U.S. Application Data

(63) Continuation of application No. 17/401,729, filed on Aug. 13, 2021, now Pat. No. 11,526,453.

(51) Int. Cl.
| | |
|---|---|
| *G06F 13/16* | (2006.01) |
| *G06F 1/10* | (2006.01) |
| *G06F 11/10* | (2006.01) |
| *G11C 7/10* | (2006.01) |
| *G11C 7/22* | (2006.01) |
| *G11C 11/4076* | (2006.01) |
| *G11C 11/4093* | (2006.01) |

(52) U.S. Cl.
CPC ............ *G06F 13/1668* (2013.01); *G06F 1/10* (2013.01); *G06F 11/1004* (2013.01); *G11C 11/4076* (2013.01); *G11C 11/4093* (2013.01)

(58) Field of Classification Search
CPC ............. G11C 7/1066; G11C 11/4093; G11C 7/1093; G11C 11/4076; G11C 7/222; G06F 11/1004; G06F 13/1668; G06F 1/10
USPC ........................................................ 710/107
See application file for complete search history.

(56) References Cited

U.S. PATENT DOCUMENTS

| | | |
|---|---|---|
| 6,029,252 A | 2/2000 | Manning |
| 6,046,947 A | 4/2000 | Chai et al. |
| 6,101,197 A | 8/2000 | Keeth et al. |
| 6,337,832 B1 | 1/2002 | Ooishi et al. |
| 6,775,755 B2 | 8/2004 | Manning |
| 7,536,666 B1 | 5/2009 | Lee et al. |
| 9,818,462 B1 | 11/2017 | Polney |
| 10,937,473 B2 | 3/2021 | Kitagawa et al. |

(Continued)

FOREIGN PATENT DOCUMENTS

CN 103177757 A 6/2013

OTHER PUBLICATIONS

CN Patent Application No. 201910417073.3—Chinese Office Action and Search Report, dated Mar. 7, 2023, with English Translation, 16 pages.

*Primary Examiner* — Chun Kuan Lee
(74) *Attorney, Agent, or Firm* — Perkins Coie LLP

(57) ABSTRACT

Methods, apparatuses, and systems related to an apparatus are described. The apparatus may include (1) a read state circuit configured to control the schedule/timing associated with parallel pipelines, and (2) a timing control circuit configured to coordinate output of data from the parallel pipelines.

20 Claims, 16 Drawing Sheets

(56) References Cited

U.S. PATENT DOCUMENTS

| | | |
|---|---|---|
| 2002/0073363 A1* | 6/2002 | Abrosimov ...... G11C 29/56012 |
| | | 714/25 |
| 2004/0203559 A1 | 10/2004 | Stojanovic et al. |
| 2010/0329041 A1 | 12/2010 | Sohn et al. |
| 2012/0230144 A1 | 9/2012 | Nagata |
| 2012/0250433 A1 | 10/2012 | Jeon |
| 2013/0141994 A1 | 6/2013 | Ito et al. |
| 2013/0155792 A1 | 6/2013 | Matsui |
| 2016/0188499 A1 | 6/2016 | Nagarajan et al. |
| 2016/0301435 A1* | 10/2016 | Su ........................... H04L 25/06 |
| 2018/0005686 A1 | 1/2018 | Oh et al. |
| 2018/0122438 A1 | 5/2018 | Manning et al. |
| 2019/0172512 A1 | 6/2019 | Oh et al. |
| 2019/0348105 A1 | 11/2019 | Brown et al. |
| 2020/0051603 A1* | 2/2020 | Kitagawa ............... G11C 7/222 |
| 2021/0067385 A1* | 3/2021 | Finn ................... H04L 25/0272 |

* cited by examiner

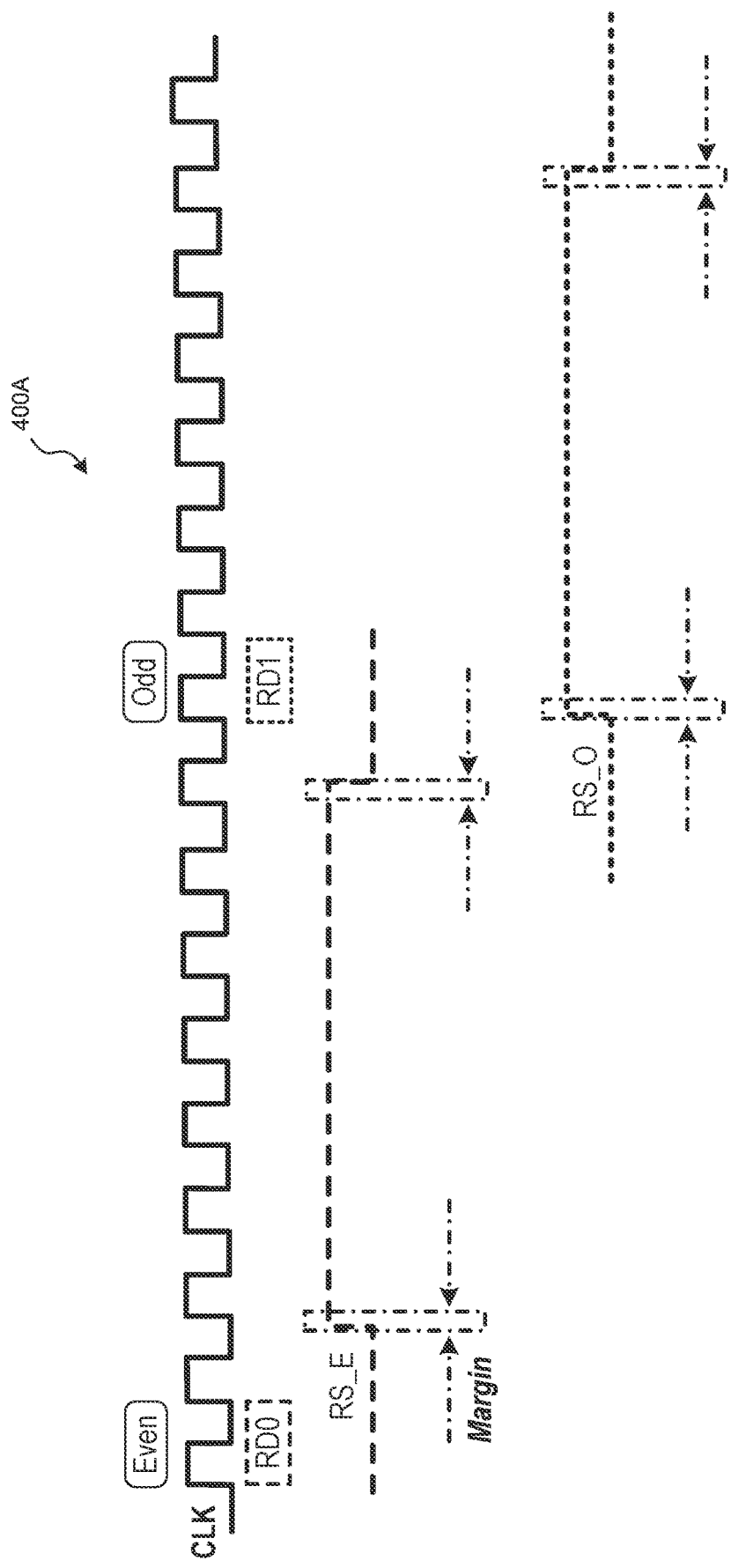

APPARATUS INCLUDING PARALLEL PIPELINES AND METHODS OF MANUFACTURING THE SAME

CROSS-REFERENCE TO RELATED APPLICATION(S)

This application is a continuation of U.S. patent application Ser. No. 17/401,729, filed Aug. 13, 2021, which is incorporated herein by reference in its entirety.

TECHNICAL FIELD

The disclosed embodiments relate to apparatuses, and, in particular, to semiconductor devices with a mechanism for managing data pipelines.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit with various improvements. Improving devices, generally, may include increasing circuit density, increasing operating speeds or otherwise reducing operational latency, increasing reliability, increasing data retention, reducing power consumption, or reducing manufacturing costs, among other metrics. However, such improvements can often introduce challenges in subsequent data processing (e.g., such as due to decrease in time windows to achieve targeted transitions) and can create sources of error in data transfers if not handled appropriately.

BRIEF DESCRIPTION OF THE DRAWINGS

FIGS. 4A-4B illustrate timing diagrams of back-to-back commands in accordance with an embodiment of the present technology.

DETAILED DESCRIPTION

Figure 1:
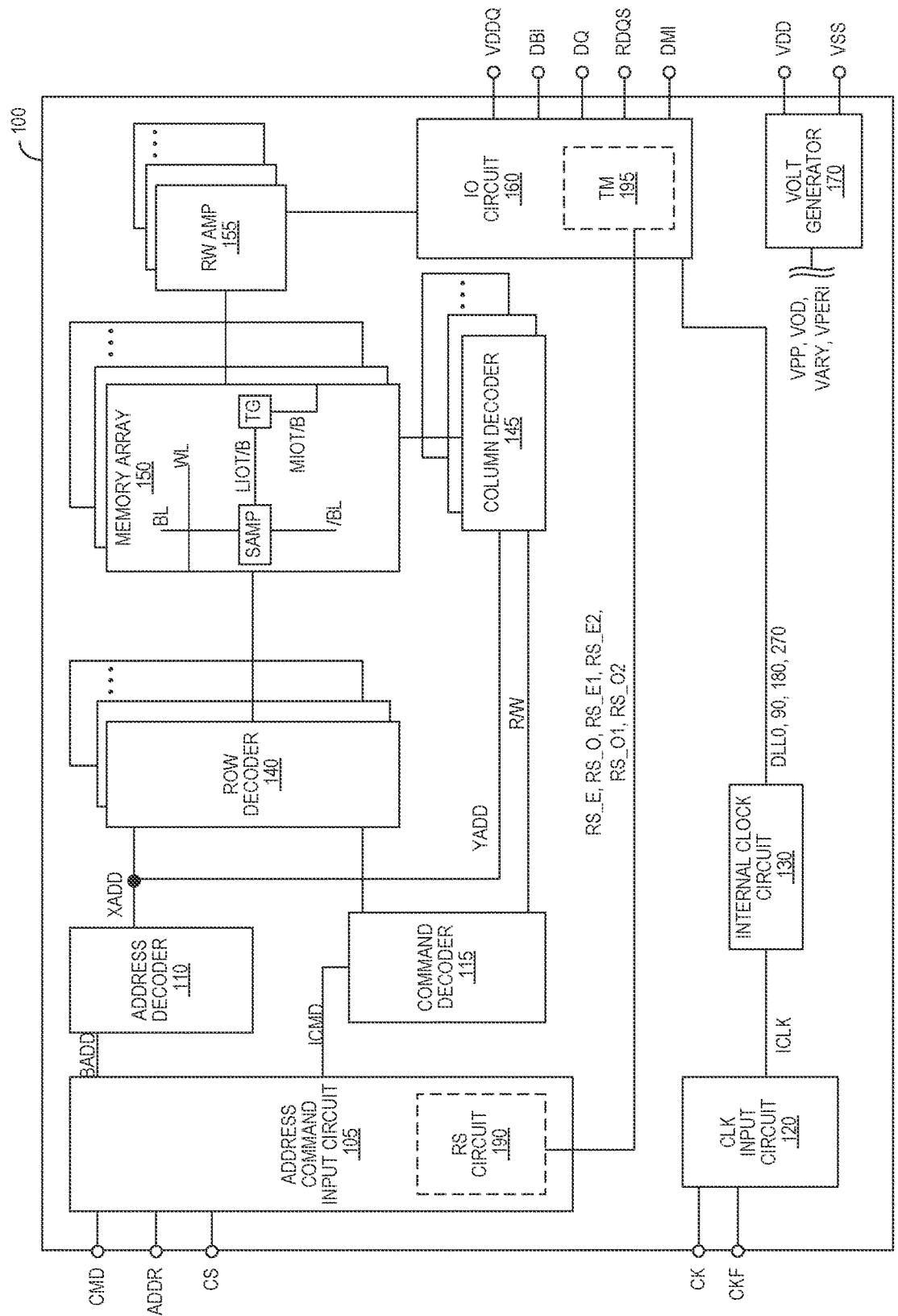
FIG. 1 is a block diagram of an apparatus in accordance with an embodiment of the present technology.

As described in greater detail below, the technology disclosed herein relates to an apparatus, such as for memory systems, systems with memory devices, related methods, etc., for managing parallel pipelines. The apparatus (e.g., a memory device and/or system including the memory device) can include a set of parallel data pipelines (e.g., an even pipeline and an odd pipeline) for processing data, such as in response to read commands (e.g., READ bursts). The apparatus can use corresponding internal clocks (e.g., an "even" clock or DLL0, "odd" clock or DLL180, etc.) having a reduced frequency relative to an external clock. The internal clocks can be phase-shifted from one another by a predetermined amount (e.g., 180°). The internal clocks can be used to coordinate delivery timing for an output path of the apparatus. In other words, the internal clocks can be used to output the read data from the parallel pipelines to an external interface (e.g., data (DQ) pads). Accordingly, the even pipeline can process read data driven by the even clock, while the odd pipeline can process read data driven by the odd clock.

As an illustrative example, the external device (e.g., a controller) can interact with the memory device (e.g., DDR memory) according to an external clock. Accordingly, the external device can issue a read command according to the external clock and receive the provided read data according to the external clock. In some embodiments, the memory device can implement N pipelines (e.g., two pipelines) that each process 1/N portion (e.g., ½ at each of the two pipelines) of the read data. The pipelines can operate according to corresponding internal clocks having 1/N the frequency of the external clock. Thus, the parallel pipelines can be used to reduce the internal operating clock, thereby reducing and eliminating errors caused by the increased clock speeds (caused by, e.g., signal slew rates overrunning the corresponding time requirements).

Since a read command may be simultaneously processed using the parallel data pipelines, the apparatus may effectively lose the granularity provided by the external clock. Accordingly, the apparatus can track which pipeline and internal clock corresponds to a first bit of the output data. For the illustrative example of two pipelines, the apparatus can arbitrarily label alternating pulses of the external clock as even and odd pulses. An even pipeline and an even internal clock can correspond to the even external clock pulses, and an odd pipeline and an odd internal clock can correspond to the odd external clock pulses. In processing a read command, the apparatus can track the even/odd status of the external clock at the time of receiving the read command. If the read command is received on an even clock pulse, the apparatus can use an even enable signal (e.g., an enable for even circuitry, an "even pointer") that flags/indicates the even clock to coordinate delivery of the first bit of the output data. If the read command is received on an odd clock pulse, the apparatus can use an odd enable signal (e.g., an enable for odd circuitry, an "odd pointer") that flags/indicates the odd clock to coordinate delivery of the first bit of the output data.

The parallel pipelines may require additional consideration to handle back-to-back processes. When two read commands are separated by an odd number of clock pulses, the two read commands can begin at alternate pipelines. Accordingly, the apparatus can alternate between the even enable signal and the odd enable signal to deliver the data. As an illustrative example, a first read command can be received at an even clock pulse and a second read command can be received at an odd clock pulse. Accordingly, the first read command can begin with the even pipeline and the second read command can begin with the odd pipeline. Also, the apparatus can first use the even enable signal and then switch to using the odd enable signal. In such instances, as the number of clock pulses separating the two read commands decreases, a timing conflict can emerge in processing the first and second read commands. When insufficient or a threshold number of clock pulses separate the two read commands, the apparatus may not have sufficient time to switch from one enable signal to the other enable signal, and the two enable signals may overlap. As described in greater detail below, this conflict is known as a "gapless burst" or gapless switchover. Without sufficient time gap, the even and odd clocks may not be able deliver bits of the output data to the output path at correct times and can cause errors in the output data. For example, if the gapless burst is not handled appropriately, trailing bits of the first output data can be neglected or merged with leading bits of the second read command.

As described in detail below, embodiments of the present technology can include circuits/functions configured to coordinate the enable signals and coordinate bit outputs for parallel pipelines. For example, the apparatus (e.g., the memory device) can include a timing control circuit configured to use (1) a set of staggered enable signals, or (2) a chopping circuit for managing a timing for the enable signals of the parallel data pipelines.

The staggered enable signals can include a sequential set of separate enable signals for each data pipeline (e.g., an even set with early and late even enable signals, and an odd set with early and late odd enable signals) that are staggered in time. For each pipeline, the timing control circuit can use (1) the early enable signal to initiate and handle delivery of leading bits of the output data and (2) the late enable signal to handle delivery of the trailing bits of the output data. Using the multiple enable signals, the early enable signal of one data pipeline can be offset or separated in time from the early enable signal of the other data pipeline. Similarly, the late enable signal of one data pipeline can be offset from the late enable signal of the other data pipeline. Accordingly, the timing control circuit can use the late enable signals to ensure that the correct trailing bits of the output data is delivered while or concurrently with using the early enable signals to transition between the two read commands.

The chopping circuit can remove unused processing durations (e.g., trailing clock pulses) of a current read command and apply them as new leading bits of a next read command. For example, when the output data includes cyclic redundancy check (CRC) data, the total number bits may not be divisible by four (e.g., remainder of dividing the total number of output bits by four may be a positive/non-zero integer). Such case may also correspond to a maximum limit on the output bit length. Accordingly, the chopping circuit can remove the trailing duration (e.g., clock pulses matching the positive/non-zero integer remainder) following the maximum output length and append them before the leading bits of the next read command. Using the chopping circuit, the timing control circuit can ensure a separation between the delivery of the trailing bits of the current read command and the delivery of the leading bits of the next read command. Accordingly, the timing control circuit can handle the even and odd enable signals in gapless burst scenarios and ensure timely and error-free delivery of bits of the output data.

FIG. 1 is a block diagram of the apparatus 100 (e.g., a semiconductor die assembly, including a 3DI device or a die-stacked package) in accordance with an embodiment of the present technology. For example, the apparatus 100 can include a DRAM (e.g., DDR4 DRAM, DDR5 DRAM, LP DRAM, HBM DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105 (e.g., command circuit), to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock pulses of the CK clock signal. For example, the read latency information RL can be a number of clock pulses of the CK signal after the read command is received by the apparatus 100 when the associated read data is provided.

Write data can be supplied to the data terminals DQ, DBI, and DMI. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1). The write latency WL information can be defined in terms of clock pulses of the CK clock signal. For example, the write latency WL information can be a number of clock pulses of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK and CKF can be supplied to a clock input circuit 120 (e.g., external clock circuit). The CK and CKF signals can be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies (e.g., provide IO clock signals at half the frequency of the external clock signal) and/or different phases (e.g., provide IO clock signals phase sifted by 0, 90, 180, and/or 270 degrees from the external clock signal) so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The command/address input circuit 105 can include a read-state (RS) circuit 190 configured to control the schedule/timing associated with the parallel pipelines. In some embodiments, the RS circuit 190 can be configured to generate and control a set of enable signals (e.g., an even enable signal and/or odd enable signal) based on a read command received at the command/address input circuit 105. The RS circuit 190 can provide the set of enable signals to a timing control circuit (TM) 195. When a read command is received at the command/address input circuit 105, the RS circuit 190 can determine whether the command was received on an even clock or an odd clock. Based on the determination, the RS circuit 190 can generate one or more corresponding enable signals to control the timing of corresponding operations across the even and/or the odd pipelines. For example, when the read command is received on an even clock pulse, the read-state circuit 190 can generate the even enable signal (e.g., RS_E) to indicate that the read command was received on the even pulse. When the read command is received on an odd clock pulse, the read-state circuit 190 can generate the odd enable signal (e.g., RS_O) to indicate that the read command was received on the odd pulse. In some embodiments, the circuit 190 can be a processing-state circuit. The processing-state circuit can be configured to generate and control the set of enable signals based on a read or write command received at the command/address input circuit 105, in a way similar to the RS circuit.

In some embodiments (e.g., when the timing control circuit 195 is implemented with a staggered enable mechanism), the read-state circuit 190 and/or the timing control circuit 195 can be configured to generate one or more additional enable signals for each data pipeline. For example, if the read command is received on an even clock, the read-state circuit 190 and/or the timing control circuit 195 can generate a first even enable signal (e.g., RS_E1) followed by a second even enable signal (e.g., RS_E2). If the read command is received on an odd clock, the read-state circuit 190 can generate a first odd enable signal (e.g., RO_E1) followed by a second odd enable signal (e.g., RS_O2).

The input/output circuit 160 can include the timing control circuit 195 configured to use the data enable signals to coordinate the output of the data from the parallel pipelines. For example, in response to the even enable signal(s), the timing control circuit 195 can use DLL0 (the even clock) to output (via, e.g., the DQ pads) the data from the even pipeline as a first bit of output data. For the odd enable signal(s), the timing control circuit 195 can use DLL180 (the odd clock) to output the data from the odd pipeline as the first bit of the output data.

Figure 2:
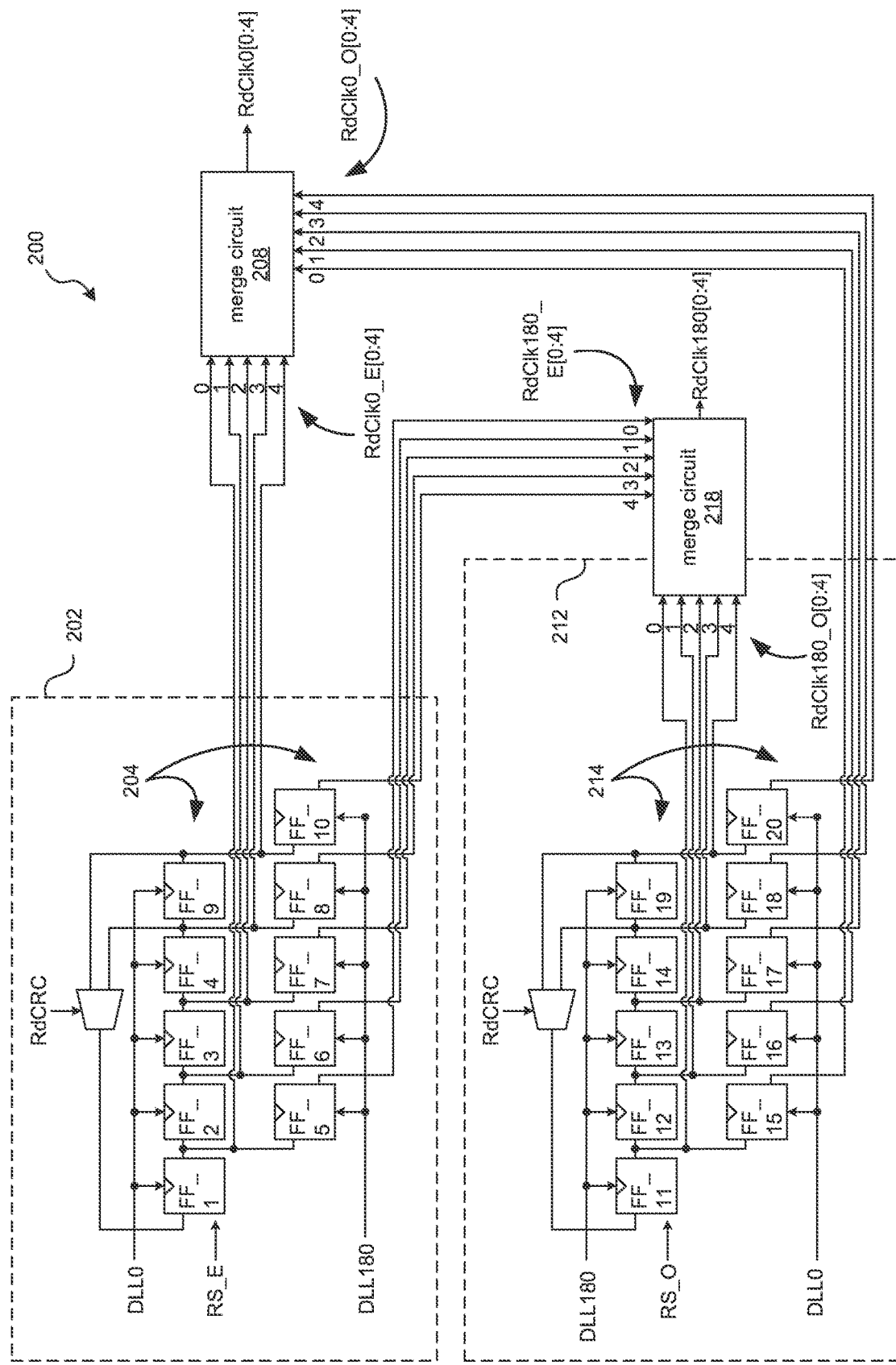
FIG. 2 is a block diagram of a timing control circuit in accordance with an embodiment of the present technology.

FIG. 2 is a block diagram 200 of a timing control circuit (e.g., the timing control circuit 195 of FIG. 1) in accordance with an embodiment of the present technology. The timing control circuit 195 can include an even circuit 202 that corresponds to or operates in response to even enable signals and an odd circuit 212 corresponds to or operates in response to odd enable signals. The even circuit 202 can be utilized when a read command is received on an even pulse of an external clock. For the even circuit 202, the timing control circuit 195 can generate an even enable signal RS_E. The even enable signal RS_E can indicate that the read command begins with the even pipeline and that a clock signal DLL0 of the even clock delivers the first bit of the read data. The even circuit 202 can include shift register 204 configured to implement shift operations synchronized with the clock signal DLL0 (e.g., the even clock) and a clock signal DLL180 (e.g., the odd clock). The shift register 204 can include n-stages of flip-flop circuits (FF_1 to FF_n) in cascade and/or parallel connection, and may be controlled by the even enable signal RS_E.

In some embodiments, the shift register 204 can include 8-stages of flip-flop circuits (FF_1 to FF_8 of the even circuit 202), with flip-flop circuits FF_1 to FF_4 in cascade connection and flip-flop circuits FF_5 to FF_8 in parallel connection. The clock signal DLL0 can be commonly input to clock nodes of flip-flop circuits FF_1 to FF_4, while the clock signal DLL180 can be commonly input to clock nodes of flip-flop circuits FF_5 to FF_8. When the clock signal DLL0 is activated, the even enable signal RS_E can control operation of the flip-flop circuit FF_1 of a first stage, and the even enable signal RS_E can be respectively shifted to the flip-flop circuits FF_2 to FF_8 of next stages. The even enable signal RS_E can then control operation of FF_2 to FF_4 in response to activation of the clock signal DLL0 and the even enable signal RS_E at FF_5 to FF_8 can be latched in response to activation of the clock signal DLL180. In some embodiments, the even circuit 202 can enable cyclic redundancy check and the shift register 204 can include 2 additional stages of flip-flop circuits FF_9 and FF_10. When cyclic redundancy check is enabled, the timing control circuit 195 can generate or receive a RdCRC enable signal. The RdCRC enable signal can control operation of the flip-flop circuits FF_9 and FF_10 of the last two stages of shift register 204 in response to activation of the clock signals DLL0 and DLL180, respectively.

The even enable signal RS_E and the RdCRC enable signal controlling operation of the flip-flop circuits FF_1 to FF_4 and FF_9, in response to activation of the clock signal DLL0, can form a sequence of clock signal elements 0 to 4 of RdClk0_E[0:4]. The even enable signal RS_E and the RdCRC enable signal latched by the flip-flop circuits FF_5 to FF_8 and FF_10, in response to activation of the clock signal DLL180, can form a sequence of clock signal elements 0 to 4 of RdClk180_E[0:4]. The timing control circuit 195 can then supply RdClk0_E[0:4] to a merge circuit 208 and RdClk180_E[0:4] to a merge circuit 218. The even circuit 202 can begin generating the RdClk0_E[0:4] before the RdClk180_E[0:4] since the read command was received on an even clock. Accordingly, the first bit of the read output can be the first bit produced by the even pipeline.

The odd circuit 212 can be utilized when a read command is received on an odd pulse of the external clock. For the odd circuit 212, the timing control circuit 195 can generate an odd enable signal RS_O. The odd enable signal RS_O can indicate that the read command begins with the odd pipeline and the clock signal DLL180 of the odd clock delivers the first bit of the read data. The odd circuit 212 can include shift register 214 configured to implement shift operations synchronized with the clock signal DLL180 (e.g., the odd clock) and the clock signal DLL0 (e.g., the even clock). The shift register 214 can include n-stages of flip-flop circuits (FF_1 to FF_n) in cascade and/or parallel connection, and may be controlled by the odd enable signal RS_O.

In some embodiments, the shift register 214 can include 8-stages of flip-flop circuits (FF_11 to FF_18 of the odd circuit 212), with flip-flop circuits FF_11 to FF_14 in cascade connection and flip-flop circuits FF_15 to FF_18 in parallel connection. The clock signal DLL180 can be commonly input to clock nodes of flip-flop circuits FF_11 to FF_14, while the clock signal DLL0 can be commonly input to clock nodes of flip-flop circuits FF_15 to FF_18. When the clock signal DLL180 is activated, the odd enable signal RS_O can control operation of the flip-flop circuit FF_11 of a first stage, and the odd enable signal RS_O can be respectively shifted to the flip-flop circuits FF_12 to FF_18 of next stages. The odd enable signal RS_O can then control operation of FF_12 to FF_14 in response to activation of the clock signal DLL180 and the odd enable signal RS_O at FF_15 to FF_18 can be latched in response to activation of the clock signal DLL0. In some embodiments, the odd circuit 212 can enable cyclic redundancy check and the shift register 214 can include 2 additional stages of flip-flop circuits FF_19 and FF_20. When cyclic redundancy check is enabled, the timing control circuit 195 can generate or receive a RdCRC enable signal (e.g., read CRC enable signal). The RdCRC enable signal can control operation of the flip-flop circuits FF_19 and FF_20 of the last two stages of shift register 214 in response to activation of the clock signals DLL180 and DLL0, respectively.

The odd enable signal RS_O and the RdCRC enable signal latched by the flip-flop circuits FF_11 to FF_14 and FF_19, in response to activation of the clock signal DLL180, can form a sequence of clock signal elements 0 to 4 of RdClk180_O[0:4]. The odd enable signal RS_O and the RdCRC enable signal latched by the flip-flop circuits FF_15 to FF_18 and FF_20, in response to activation of the clock signal DLL0, can form a sequence of clock signal elements 0 to 4 of RdClk0_O[0:4]. The timing control circuit 195 can then supply the sequence RdClk180_O[0:4] to the merge circuit 218 and the sequence RdClk0_O[0:4] to the merge circuit 208. The merge circuit 208 can output the sequence RdClk0[0:4], while the merge circuit 218 can output the sequence RdClk180[0:4]. The odd circuit 212 can begin generating the RdClk180_O [0:4] before the RdClk0_O[0:4] since the read command was received on an odd clock. Accordingly, the first bit of the read output can be the first bit produced by the odd pipeline.

The merge circuits 208 and 218 can each be configured to include a set of logic gates that combine the outputs from the even and odd circuits to generate a coordinating clock signal for the corresponding pipeline. For example, the merge circuit 208 can include circuitry to combine RdClk0_E[0:4] and RdClk0_O[0:4] to generate RdClk0[0:4]. In some embodiments, the merge circuits 208 and 218 can include a set of OR gates that each receive corresponding coordination bits (e.g., RdClk bits 0-3) from the even and odd circuits. Accordingly, the merge circuits can allow the active clock bits from either the even or the odd circuits to pass through as the read clock.

The number of OR gates in the merge circuits 208 and 218 can correspond to the number of flip-flops circuits in the shift registers 204 and 214. For example, if the shift registers 204 and 214 each include n-stages of flip-flop circuits, then merge circuits 208 and 218 can each be configured with n-OR gates.

Figure 3A:
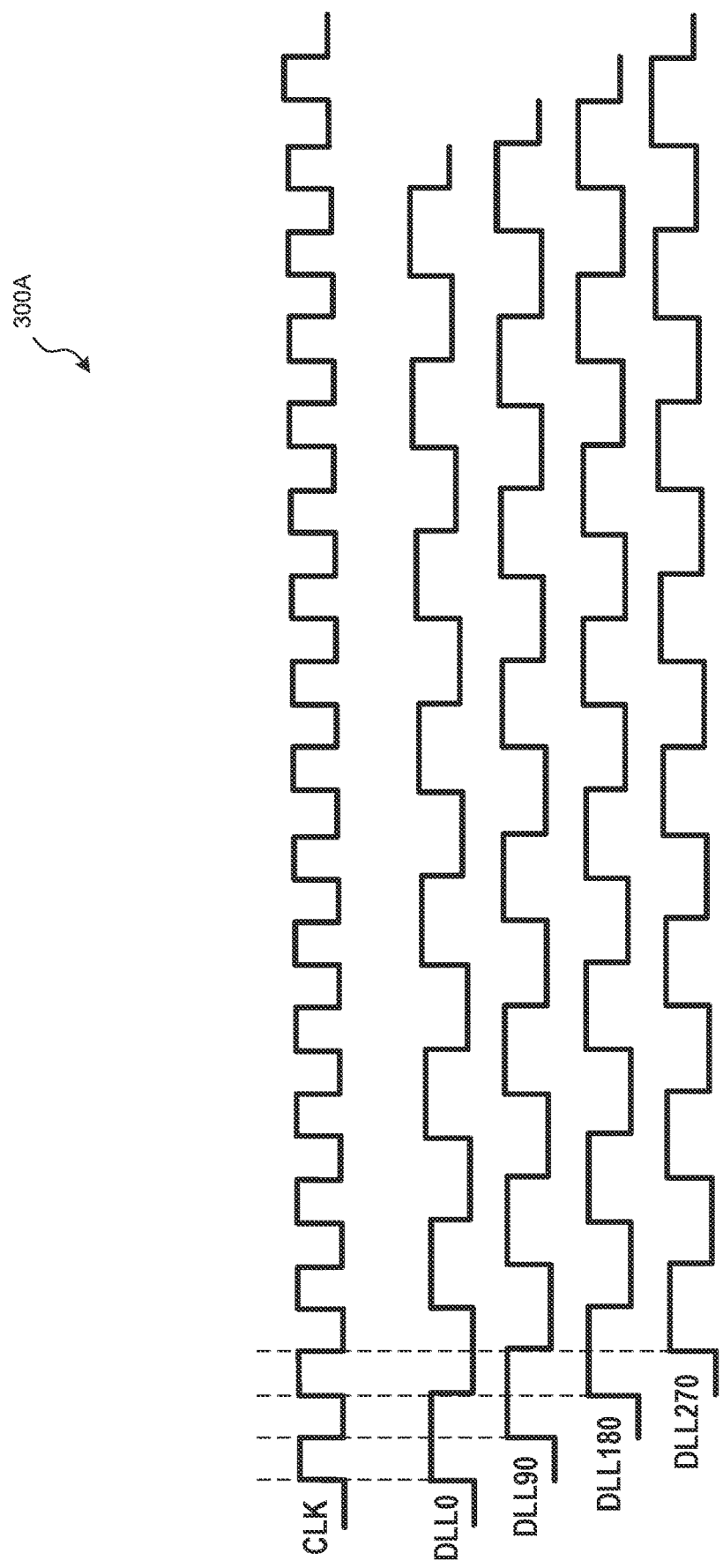
FIGS. 3A-3C illustrate timing diagrams of internal and external clocks in accordance with an embodiment of the present technology.
Figure 3B:
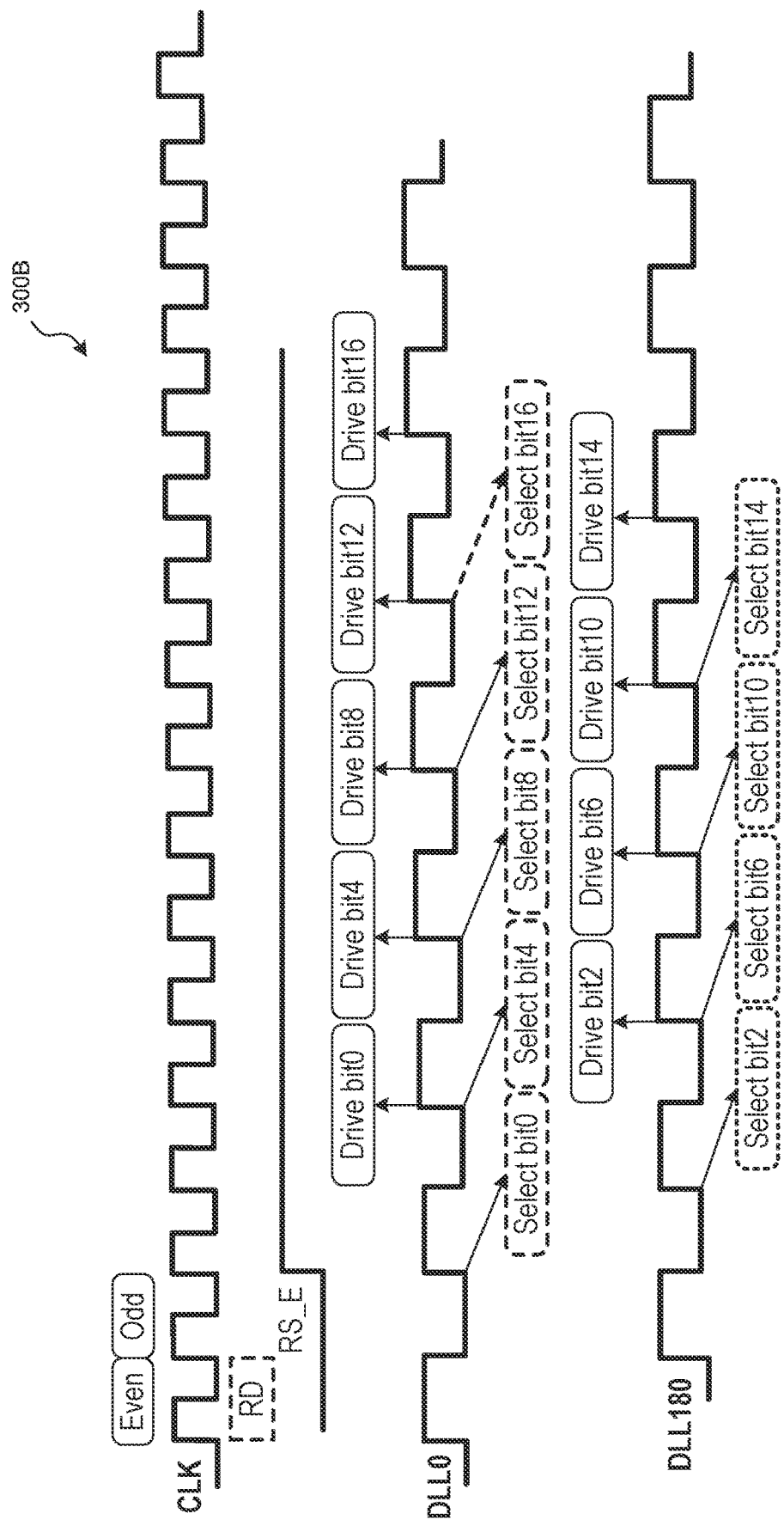
Figure 3C:
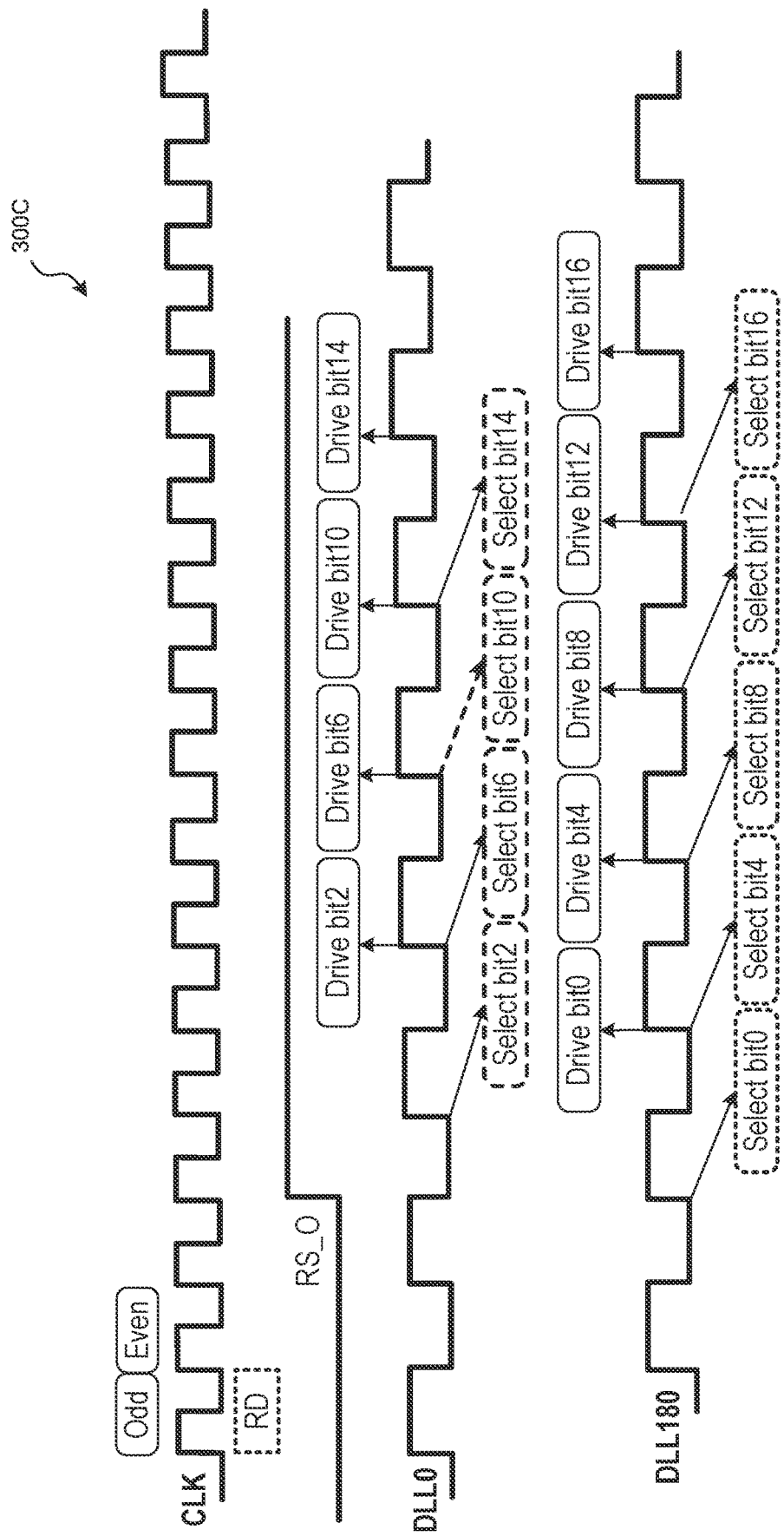

FIGS. 3A-3C illustrate timing diagrams of internal and external clocks in accordance with an embodiment of the present technology. FIG. 3A illustrates a timing diagram 300A of internal clock signals DLL0, DLL90, DLL180, and DLL270 and an external clock signal CLK in accordance with an embodiment of the present technology. The clock circuit (e.g., the clock input circuit 120 of FIG. 1) can process the external clock signal CLK, generated by an external device according to an external frequency. The RS Circuit 190 can identify the external clock signal as a repeating sequence of N number of clock pulses. Each pulse in the sequence can correspond to one of N number of pipelines of processing data according to commands received at the command circuit 105. In some embodiments, the external clock signal CLK can be a sequence of 2 clock pulses, where each pulse in the repeating sequence of 2 pulses can correspond to one of 2 pipelines (e.g., an even pipeline or an odd pipeline). For illustrative purposes, embodiments of the present technology will be described using the two-pipeline configuration where N=2 and the external clocks correspond to even and odd pulses. However, it is understood that the apparatus may be implemented with any number of pipelines (i.e., N>2).

In some embodiments, such as for DDR devices, the internal clock circuit 130 can generate the internal clock signals DLL0, DLL90, DLL180, and DLL270 based on the external clock signal CLK. Each of the internal clock signals can have an internal frequency that is 1/N of the external frequency. In some embodiments, the internal frequency can be ½ (e.g., when N=2) of the external frequency when the external clock signal CLK is a sequence of 2 pulses corresponding to 2 pipelines. Each of the internal clock signals can be phase-shifted from one another by a predetermined amount. For example, DLL90 can be phase-shifted from DLL0 by 90 degrees, DLL180 can be phase-shifted from DLL90 by 90 degrees, and DLL270 can be phase-shifted from DLL180 by 90 degrees. As an illustrative example, DLL0 can be aligned with the rising edge of a first external clock pulse and DLL90 can be aligned with the falling edge of the first external clock pulse. Similarly, DLL180 can be aligned with a rising edge of a second external clock pulse immediately following the first external clock pulse, and DLL270 can be aligned with the falling edge of the second external clock pulse. For DDR implementations, each of DLL0, DLL90, DLL180, and DLL270 can be used to coordinate communication of data (e.g., read data) between the memory device and the controller/host.

FIG. 3B illustrates a timing diagram 300B corresponding to the even circuit 202 of FIG. 2 in accordance with an embodiment of the present technology. The timing diagram 300B can illustrate the internal clock signals DLL0 and DLL180 and the external clock signal CLK. In some embodiments, the external clock signal CLK can be a sequence of 2 clock pulses with an even clock pulse and odd clock pulse. In other words, the external clock signal CLK can be identified as a sequence of alternating even and odd clock pulses. The even clock pulses of the external clock signal CLK can be aligned with the even internal clock or DLL0, and the odd clock pulses of the external clock signal CLK can be aligned with the odd internal clock or DLL180. Although not showing in the timing diagram 300B, the falling edges of the even and odd pulses can align with the DLL90 and DLL270 as described above.

For the example illustrated by the timing diagram 300B, the command circuit 105 can receive a read command (RD) on an even clock pulse from an external source. In response to receiving RD, the RS circuit 190 can generate the even enable signal RS_E. For the DDR implementation, the even pipeline can receive the even enable signal and process bits 0, 1, 4, 5, 8, 9, 12, 13, 16, and 17 of data stored at an address that accompanied the RD. The odd pipeline can process bits 2, 3, 6, 7, 10, 11, 14, and 15 of the stored unit of data. In other words, the even pipeline can process a portion of the bits of the stored unit of data, and the odd pipeline can process another portion of the bits of the stored unit of data. The even enable signal RS_E can flag/indicate that DLL0 delivers the first bit (e.g., DLL0 delivers bit0) of read data provided in response to the received command RD.

In some embodiments, the RS circuit 190 can generate the even enable signal RS_E one or more clock pulses after the command RD is received. For example, in the timing diagram 300B, the even enable signal RS_E can be generated 2 clock pulses after the command RD is received.

The timing control circuit 195 can be configured to coordinate the sequence, controlled by the even enable signal RS_E and the odd enable signal RS_O, used to combine outputs from the pipelines to correspond to the data unit. In response to the even enable signal RS_E flagging/indicating that DLL0 delivers the first bit of the read data, the even clock DLL0 and odd clock DLL180 can be used to deliver different portions of the read data. The apparatus can use DLL0 to deliver the bits 0, 4, 8, 12, and 16 that are positioned or aligned with the rising edges of the even clock pulses of the external clock signal CLK. The apparatus can use DLL180 to deliver bits 2, 6, 10, and 14 that are positioned or aligned with the rising edges of the odd clock pulses of the external clock signal CLK. In the timing diagram 300B, the first bit or bit0 can be selected based on receiving the even enable signal RS_E. The selected bit can be driven on the next rising edge of DLL0. In other words, bit0 can be driven one or more clock pulses after being selected. Accordingly, bits1-16 are also driven one or more clock pulses after being selected.

FIG. 3C illustrates a timing diagram 300C corresponding to the odd circuit 212 of FIG. 2 in accordance with an embodiment of the present technology. The timing diagram 300C can illustrate the internal clock signals DLL0 and DLL180 and the external clock signal CLK. In some embodiments, the external clock signal CLK can be a sequence of 2 clock pulses with an even clock pulse and odd clock pulse. In other words, the external clock signal CLK can identified as a sequence of alternating even and odd clock pulses. The even clock pulses of the external clock signal CLK can be aligned with the even internal clock or DLL0. The odd clock pulses of the external clock signal CLK can be aligned with the odd internal clock or DLL180. Although not showing in the timing diagram 300C, the falling edges of the even and odd pulses can align with the DLL90 and DLL270 as described above.

For the example illustrated by the timing diagram 300C, the command circuit 105 can receive a read command RD on an odd clock pulse from, e.g., an external device. In response to receiving RD, the RS circuit 190 can generate the odd enable signal RS_O. For the DDR implementations, the odd pipeline can receive the odd enable signal RS_O and process bits 0, 1, 4, 5, 8, 9, 12, 13, 16, and 17 of data stored at an address that accompanied the RD. The even pipeline can process bits 2, 3, 6, 7, 10, 11, 14, and 15 of the stored unit of data. In other words, the odd pipeline can process a portion of the bits of the stored unit of data, and the even pipeline can process another portion of the bits of the stored unit of data. The odd enable signal RS_O can flag/indicate that DLL180 delivers the first bit (e.g., DLL180 delivers bit0) of read data provided in response to the received command RD.

In some embodiments, the RS circuit 190 can generate the odd enable signal RS_O one or more clock pulses after the command RD is received. For example, in the timing diagram 300C, the odd enable signal RS_O can be generated 2 clock pulses after the command RD is received.

The timing control circuit 195 can be configured to coordinate the sequence, controlled by the even enable signal RS_E and the odd enable signal RS_O, used to combine outputs from the N number of pipelines to correspond to the data unit. In response to the odd enable signal RS_O flagging/indicating that DLL180 delivers the first bit of the read data, the odd clock DLL180 and even clock DLL0 can be used to deliver different portions of the read data. The apparatus can use DLL180 to deliver the bits 0, 4, 8, 12, and 16 that are positioned or aligned with the rising edges of odd clock pulses of the external clock signal CLK. The apparatus can use DLL0 to deliver bits 2, 6, 10, and 14 that are positioned or aligned with the rising edges of even clock pulses of the external clock signal CLK. In the timing diagram 300C, the first bit or bit0 can be selected based on receiving the odd enable signal RS_O. The selected bit can be driven on the next rising edge of DLL180. In other words, bit0 can be driven one or more clock pulses after being selected. Accordingly, bits1-16 are also driven one or more clock pulses after being selected.

Figure 4B:
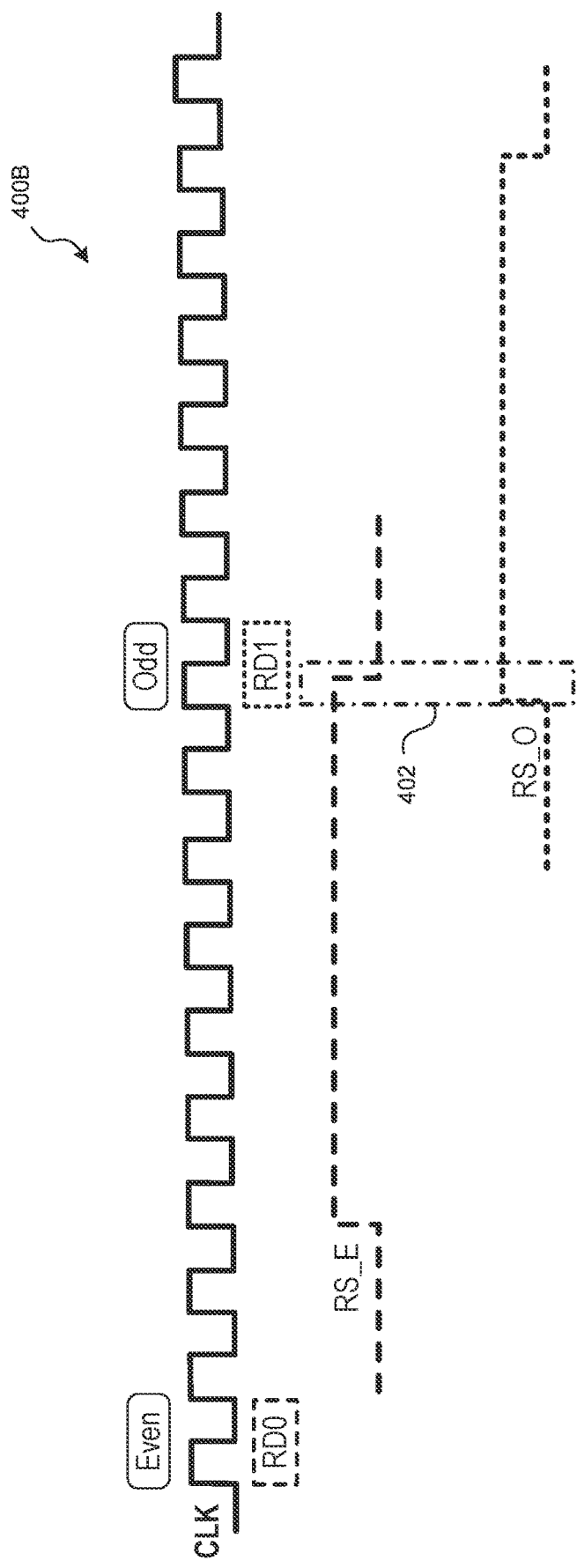

FIGS. 4A-4B illustrate timing diagrams of back-to-back commands in accordance with an embodiment of the present technology. The timing diagrams are for illustrating operations of the parallel pipeline in response to two received commands (e.g., read commands). When the back-to-back commands are received on matching pulses, such as arriving on even pulses, the enable signals can remain on and the same circuits can be used to coordinate the output. In contrast, the apparatus may be required to switch the processing circuits or pipeline coordination when the back-to-back commands are received on different pulses (e.g., even for the preceding command and odd for the subsequent command). Accordingly, FIGS. 4A-4B may illustrate the operations for the non-matching arrivals of the back-to-back commands.

FIG. 4A illustrates a timing diagram 400A representative of back-to-back commands received with sufficient separation. The command circuit 105 of FIG. 1 can receive the first command RD0 on an even clock pulse of the external clock CLK. In response to the first command RD0 being received on the even clock pulse, the RS circuit 190 can generate the even enable signal RS_E of FIG. 2. The even enable signal RS_E can coordinate the read data output as described above. The even enable signal RS_E can subsequently form an envelope around a burst of the read data provided by the first command RD0 (e.g., first read data) and can be used to deliver bits of the read data. An odd number of clock pulses after receiving the first command RD0, the command circuit 105 can receive a second read command RD1 on an odd clock pulse of the external clock CLK. In response to the second command RD1, the RS circuit 190 can generate the odd enable signal RS_O that coordinates the read data output. In other words, the apparatus 100 can switch from using the even enable signal to the odd enable signal. The odd enable signal RS_O can subsequently form an envelope around a burst of the read data provided by the second command RD1 (e.g., second read data) and can be used to deliver bits of the read data.

In some embodiments, due to a latency between when the enable signal is generated and when the burst of the read data is issued, there can be a margin of separation between the time the enable signal is generated and the time the burst of the read data is driven or output from the memory device. Similarly, there can be a margin of separation between the time the enable signal is disabled and the time the burst of the read data finishes delivery. The greater the latency and time difference, the greater the margin. The lesser the latency and time difference, the lesser the margin. Accordingly, the enable signal can be generated before the burst is issued to ensure the enable signal can envelope all the bits of the read data.

In the timing diagram 400A, the first command RD0 and the second command RD1 can be received with sufficient separation. The separations may be sufficient when the corresponding number of clock pulses satisfy a predetermined threshold, which may be associated with a duration required to implement the command (e.g., output bit length). In some embodiments, when cyclic redundancy check is not enabled, the first command RD0 and the second command RD1 can be sufficiently separated when there are at least 8 clock pulses separating the two commands. When cyclic redundancy check is enabled, the first command RD0 and the second command RD1 can be sufficiently separated when there are at least 9 clock pulses separating the two commands to account for cyclic redundancy check data. Due to the sufficient separation between the two commands, the apparatus 100 can have sufficient time to switch from one enable signal to the other enable signal (e.g., even enable signal to odd enable signal, or odd enable signal to even enable signal) and maintain separation between the first read data and the second read data. Accordingly, the apparatus 100 can correctly deliver all of the bits of a first read data using a first enable signal, and then timely switch to using a second enable signal to deliver all of the bits of a second read data. In other words, when there is sufficient separation between two commands, the first enable signal can always envelope the entire burst of bits of the read data provided by the first command, and the second enable signal can always envelope the entire burst of bits of the read data provided by the second command.

For example, as shown in the timing diagram 400A, the RS circuit 190 can first generate the even enable signal RS_E, when the first command RD0 is received on the even pulse. The apparatus 100 can then use the even enable signal to deliver bits of the first read data. The RS circuit 190 can then receive the second command RD1 on the odd pulse and subsequently generate the odd enable signal RS_O. Since there is sufficient separation between the first command RD0 and second command RD1, the apparatus 100 has already finished delivering all the bits of the first read data when the odd enable signal RS_O is used. Accordingly, the apparatus 100 can use the odd enable signal RS_O to deliver all the bits of the second read data without conflict with the delivery of the first read data. Although the scenario when a command received on an even pulse is followed by a command received on an odd pulse is shown in the timing diagram 400A, a scenario in which a first command is received on the odd pulse is followed by a second command being received on the even pulse can similarly occur. Accordingly, the RS circuit 190 can generate the odd enable signal RS_O for the first command and the even enable signal RS_E for the second command. The apparatus 100 can use the odd enable signal RS_O to deliver bits of the first read data and the even enable signal RS_E to deliver bits of the second read data.

FIG. 4B illustrates a timing diagram 400B representative of back-to-back commands received with insufficient separation. In some embodiments, timing conflicts may occur when consecutively received commands are separated by a specific number of clock pulses, such as 9 clock pulses when CRC readout is required (e.g., corresponding to 10 output data units). In such instances, the apparatus 100 may not have sufficient time to switch from one enable signal to the other enable signal (e.g., even enable signal to odd enable signal, or odd enable signal to even enable signal). For example, the trailing bits of a first read data (e.g., provided by the first command RD0) may correspond to a first enable signal (e.g., the even enable signal RS_E), while leading bits of a second read data (e.g., provided by the second command RD1) may correspond to a second enable signal (e.g., the odd enable signal RS_O). Accordingly, the apparatus 100 may not have sufficient time to deliver all of the first read data before switching to the second enable signal. In other words, when there is insufficient separation between two commands, the first enable signal is not able to envelope the entire burst of bits of the first read data. Activating both even and odd enables can activate both even and odd circuits of FIG. 2, thereby simultaneously delivering both even and odd outputs to the merge circuits. The simultaneously delivered outputs can clash and corrupt the outputs at the merge circuits. The insufficient separation can be known as a gapless burst scenario 402 or gapless switchover, where trailing bits of the first read data can be neglected or merged with leading bits of the second read data when a switch to the second enable signal occurs.

For example, as shown in the timing diagram 400B, the RS circuit 190 can first generate the even enable signal RS_E, when the first command RD0 is received on the even pulse. The apparatus 100 can then use the even enable signal to deliver bits of the first read data. The RS circuit 190 can then receive the second command RD1 on the odd pulse and subsequently generate the odd enable signal RS_O. Since there is insufficient separation between the first command RD0 and second command RD1, the apparatus 100 has not finished delivering all the bits of the first read data when the odd enable signal RS_O is used. Notwithstanding, the apparatus 100 proceeds to deliver bits of the second read data using the odd enable signal RS_O, resulting in trailing bits of the first read data being undelivered or merged with leading bits of the second read data. The gapless burst scenario 402 can result in errors or corruption in the output data. Although the scenario when a command received on an even pulse is followed by a command received on an odd pulse is shown in the timing diagram 400B, a scenario in which a first command is received on the odd pulse is followed by a second command being received on the even pulse can similarly occur. Accordingly, the RS circuit 190 can generate the odd enable signal RS_O for the first command and the even enable signal RS_E for the second command. The apparatus 100 can use the odd enable signal RS_O to deliver bits of the first read data and the even enable signal RS_E to deliver bits of the second read data.

Figure 5A:
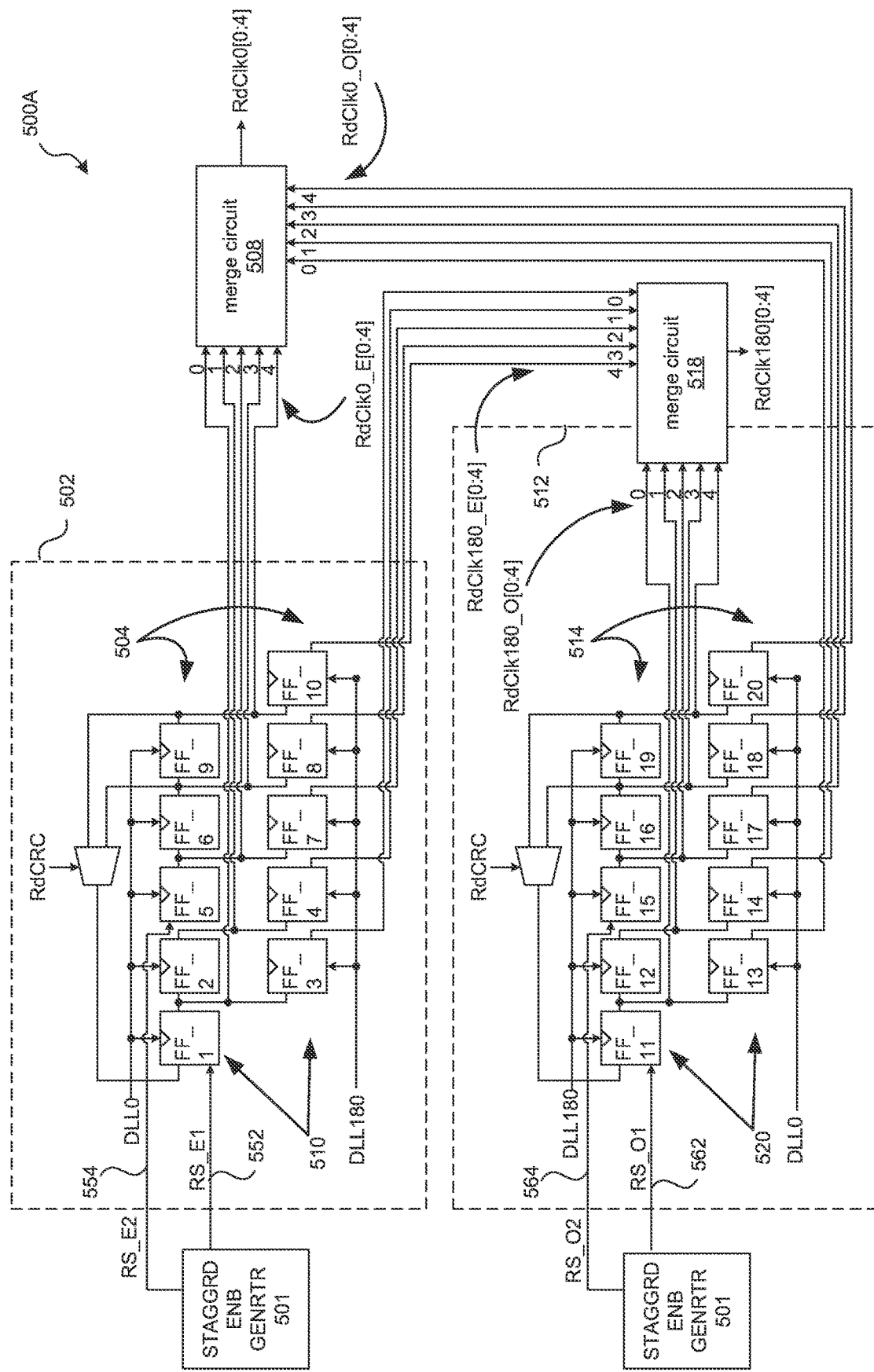
FIGS. 5A-5B illustrate the timing control circuit configured to use staggered enable signals in accordance with an embodiment of the present technology.
Figure 5B:
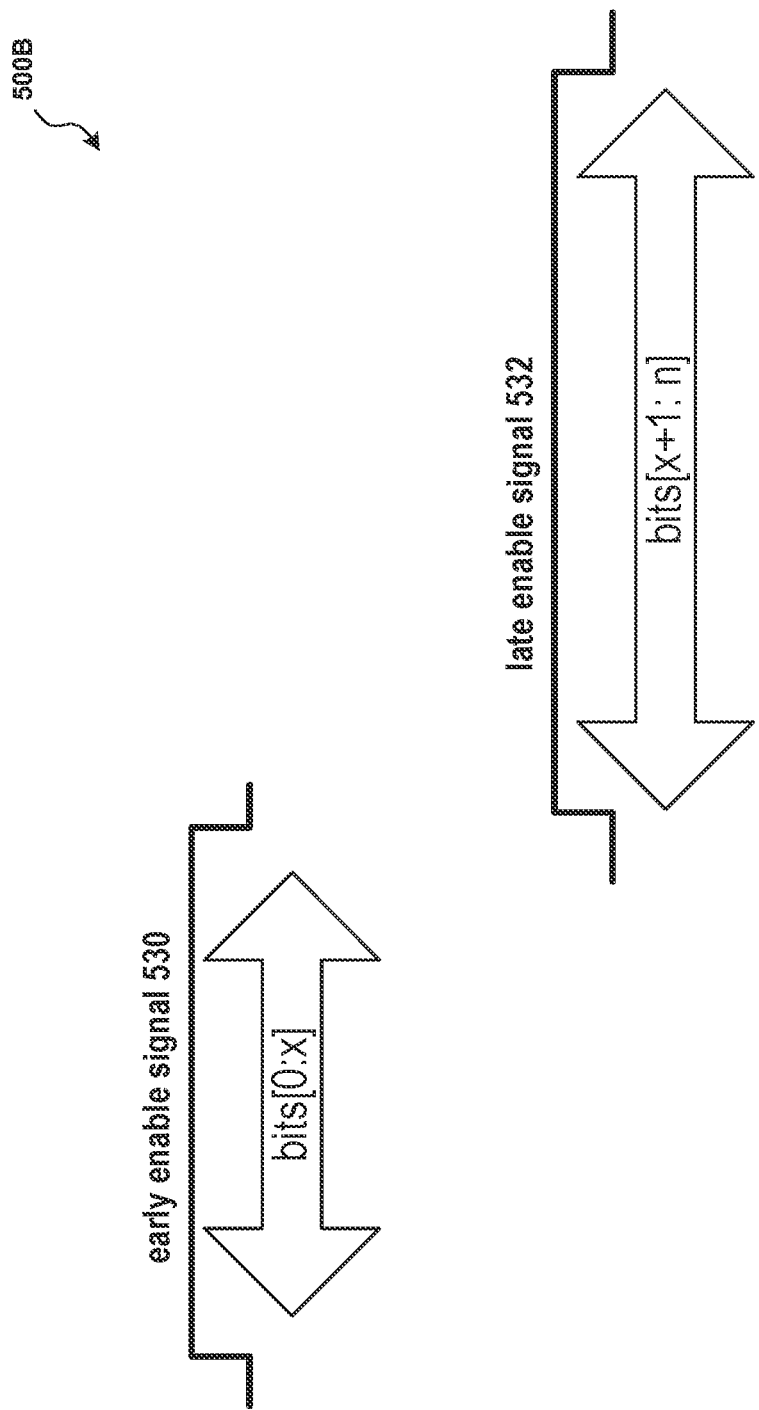

FIGS. 5A-5B illustrate the timing control circuit 195 configured to use staggered enable signals in accordance with an embodiment of the present technology. FIG. 5A is a block diagram 500A of the timing control circuit 195 configured to use the staggered enable signals RS_E1 552, RS_E2 554, RS_O1 562, and RS_O2 564 in accordance with an embodiment of the present technology. The apparatus 100 of FIG. 1 can include a staggered enable generator 501 configured to generate the RS_E1 552, the RS_E2 554, the RS_O1 562, and/or the RS_O2 564. The staggered enable generator 501 can include logic and drivers for generating the RS_E1 552, the RS_E2 554, the RS_O1 562, and/or the RS_O2 564. For example, the staggered enable generator 501 can include logic and/or delay circuits configured to generate the RS_E2 554 or the RS_O2 564 after a predetermined delay duration following the RS_E1 552 or the RS_O1 562, respectively.

In some embodiments, the RS circuit 190 can include the staggered enable generator 501. For example, the RS circuit 190 can use the staggered enable generator 501 to send the RS_E1 552 and subsequently the RS_E2 554 to the timing control circuit 195 when the read command is received on an even clock pulse. Also, the RS circuit 190 can send the RS_O1 562 followed by the RS_O2 564 when the read command is received on an odd clock pulse. In other embodiments, the timing control circuit 195 can include the staggered enable generator 501. The RS circuit 190 can generate and send the first of the enable signals or a trigger signal to the staggered enable generator 501. The staggered enable generator 501 can respond by generating the staggered enable signals as described above.

The timing control circuit 195 can include a staggered even circuit 502 that corresponds to or operates in response to even enable signals, and a staggered odd circuit 512 that corresponds to or operates in response to odd enable signals. The staggered even circuit 502 can be utilized when a command is received on an even pulse of the external clock.

The staggered even circuit 502 can include shift register 504 and shift register 510 each configured to implement shift operations synchronized with the clock signal DLL0 of the even clock and a clock signal DLL180 of the odd clock. The shift register 510 and the shift register 504 can each include a predetermined number of flip-flop circuits in cascade and/or parallel connection that may be controlled by the early even enable signal RS_E1 and the late even enable signal RS_E2, respectively. The shift register 510 can be operated or enabled according to the RS_E1 552, and the shift register 504 can be operated or enabled according to the RS_E2 554. Accordingly, the shift register 510 can generate an initial portion of the internal clock pulses (e.g., RdClk0_E [0:x<4]), and the shift register 504 can generate a subsequent portion of the internal clock pulses (e.g., RdClk0_E[x+1:4]).

In some embodiments, the shift register 510 can include 4-stages of flip-flop circuits (FF_1 to FF_4 of the staggered even circuit 502), with flip-flop circuits FF_1 to FF_2 in cascade connection and flip-flop circuits FF_3 to FF_4 in parallel connection that may be controlled by the data at the early even enable signal RS_E1. The clock signal DLL0 can be commonly input to clock nodes of flip-flop circuits FF_1 to FF_2, while the clock signal DLL180 can be commonly input to clock nodes of flip-flop circuits FF_3 to FF_4. When the clock signal DLL0 is activated, the early even enable signal RS_E1 can control operation of the flip-flop circuit FF_1 of a first stage, and the early even enable signal RS_E1 can be respectively shifted to the flip-flop circuits FF_2 to FF_4 of next stages. The early even enable signal RS_E1 can then control operation of FF_2 in response to activation of the clock signal DLL0 and the early even enable signal RS_E1 can then control operation of FF_3 to FF_4 in response to activation of the clock signal DLL180.

The shift register 504 can include 4-stages of flip-flop circuits (FF_5 to FF_8 of the staggered even circuit 502), with flip-flop circuits FF_5 to FF_6 in cascade connection and flip-flop circuits FF_7 to FF_8 in parallel connection. The clock signal DLL0 can be commonly input to clock nodes of flip-flop circuits FF_5 to FF_6, while the clock signal DLL180 can be commonly input to clock nodes of flip-flop circuits FF_7 to FF_8. When the clock signal DLL0 is activated, the late even enable signal RS_E2 can control operation of the flip-flop circuit FF_5 of a first stage, and the late even enable signal RS_E2 can be respectively shifted to the flip-flop circuits FF_6 to FF_8 of next stages. The late even enable signal RS_E2 can then control operation of FF_6 in response to activation of the clock signal DLL0 and the late even enable signal RS_E2 can then control operation of FF_7 to FF_8 in response to activation of the clock signal DLL180. In some embodiments, the staggered even circuit 502 can enable cyclic redundancy check and the shift register 504 can include 2 additional stages of flip-flop circuits FF_9 and FF_10. When cyclic redundancy check is enabled, the timing control circuit 195 can generate or receive a RdCRC enable signal. The RdCRC enable signal can control operation of the flip-flop circuits FF_9 and FF_10 of the last two stages of shift register 504 in response to activation of the clock signal DLL0 and DLL180, respectively.

The even enable signals and the RdCRC enable signal latched by the flip-flop circuits FF_1 to FF_2, FF_5 to FF_6, and FF_9, in response to activation of the clock signal DLL0, can form a sequence of clock signal elements 0 to 4 of RdClk0_E[0:4]. The even enable signals and the RdCRC enable signal latched by the flip-flop circuits FF_3 to FF_4, FF_7 to FF_8, and FF_10, in response to activation of the clock signal DLL180, can form a sequence of clock signal elements 0 to 4 of RdClk180_E[0:4]. The timing control circuit 195 can then supply the sequence RdClk0_E[0:4] to a merge circuit 508 and the sequence RdClk180_E[0:4] to a merge circuit 518. In some embodiments, the merge circuit 508 and merge circuit 518 can correspond to the merge circuit 208 and merge circuit 218 of FIG. 2, respectively.

The staggered odd circuit 512 can be utilized when a command is received on an odd pulse of the external clock. The staggered odd circuit 512 can include shift register 514 and shift register 520 each configured to implement shift operations synchronized with the clock signal DLL0 of the even clock and the clock signal DLL180 of the odd clock. The shift register 520 and the shift register 514 can each include a predetermined number of flip-flop circuits in cascade and/or parallel connection that may be controlled by the early odd enable signal RS_O1 and the late odd enable signal RS_O2, respectively. The shift register 520 can be operated or enabled according to the RS_O1 562, and the shift register 514 can be operated or enabled according to the RS_O2 564. Accordingly, the shift register 520 can generate an initial portion of the internal clock pulses (e.g., RdClk180_O [0:x<4]), and the shift register 504 can generate a subsequent portion of the internal clock pulses (e.g., RdClk180_O [x+1:4]).

In some embodiments, the shift register 520 can include 4-stages of flip-flop circuits (FF_11 to FF_14 of the staggered odd circuit 512), with flip-flop circuits FF_11 to FF_12 in cascade connection and flip-flop circuits FF_13 to FF_14 in parallel connection, that may be controlled by the data at the early odd enable signal RS_O1. The clock signal DLL180 can be commonly input to clock nodes of flip-flop circuits FF_11 to FF_12, while the clock signal DLL0 can be commonly input to clock nodes of flip-flop circuits FF_13 to FF_14. When the clock signal DLL180 is activated, the early odd enable signal RS_O1 can control operation of the flip-flop circuit FF_11 of a first stage, and the early odd enable signal RS_O1 can be respectively shifted to the flip-flop circuits FF_12 to FF_14 of next stages. The early odd enable signal RS_O1 can then control operation of FF_12 in response to activation of the clock signal DLL180 and the early odd enable signal RS_O1 can then control operation of FF_13 to FF_14 in response to activation of the clock signal DLL0.

The shift register 514 can include 4-stages of flip-flop circuits (FF_15 to FF_18 of the staggered odd circuit 512), with flip-flop circuits FF_15 to FF_16 in cascade connection and flip-flop circuits FF_17 to FF_18 in parallel connection. The clock signal DLL180 can be commonly input to clock nodes of flip-flop circuits FF_15 to FF_16, while the clock signal DLL0 can be commonly input to clock nodes of flip-flop circuits FF_17 to FF_18. When the clock signal DLL180 is activated, the late odd enable signal RS_O2 can control operation of the flip-flop circuit FF_15 of a first stage, and the late odd enable signal RS_O2 can be respectively shifted to the flip-flop circuits FF_16 to FF_18 of next stages. The late odd enable signal RS_O2 can then control operation of FF_16 in response to activation of the clock signal DLL180 and the late odd enable signal RS_O2 at FF_17 to FF_18 can be latched in response to activation of the clock signal DLL0. In some embodiments, the staggered odd circuit 512 can enable cyclic redundancy check and the shift register 514 can include 2 additional stages of flip-flop circuits FF_19 and FF_20. When cyclic redundancy check is enabled, the timing control circuit 195 can generate or receive a RdCRC enable signal. The RdCRC enable signal can control operation of the flip-flop circuits FF_19 and FF_20 of the last two stages of shift register 514 in response to activation of the clock signal DLL180 and DLL0, respectively.

The odd enable signals and the RdCRC enable signal latched by the flip-flop circuits FF_11 to FF_12, FF_15 to FF_16, and FF_19, in response to activation of the clock signal DLL180, can form a sequence of clock signal elements 0 to 4 of RdClk180_O [0:4]. The odd enable signals and the RdCRC enable signal latched by the flip-flop circuits FF_13 to FF_14, FF_17 to FF_18, and FF_20, in response to activation of the clock signal DLL0, can form a sequence of clock signal elements 0 to 4 of RdClk0_O[0:4]. The timing control circuit 195 can then supply the sequence RdClk0_O[0:4] to the merge circuit 508 and the sequence RdClk180_O[0:4] to the merge circuit 518. In some embodiments, the merge circuit 508 and merge circuit 518 can correspond to the merge circuit 208 and merge circuit 218 of FIG. 2, respectively. The merge circuit 508 can output the sequence RdClk0[0:4], while the merge circuit 518 can output the sequence RdClk180[0:4].

FIG. 5B illustrates a timing diagram 500B of staggered enable signals in accordance with an embodiment of the present technology. The timing control circuit 195 can be configured to use the staggered enable signals to deliver bits of output data provided by a command. The staggered enable signals can include an even set with an early even enable signal and a late even enable signal, and an odd set with an early odd enable signal and a late odd enable signal. The early even enable signal can be offset from the late even enable signal, and the early odd enable signal can be offset from the late odd enable signal. For example, the early enable signal 530 can be the early even enable signal RS_E1 and the late enable signal 532 can be the late even enable signal RS_E2. Alternatively, the early enable signal 530 can be the early odd enable signal RS_O1 and the late enable signal 532 can be the late odd enable signal RS_O2. In some embodiments, the RS circuit 190 can generate the early enable signal 530 and the late enable signal 532. The timing control circuit 195 can then receive the staggered enable signals from the RS circuit 190. In other embodiments, the timing control circuit 195 can generate the early enable signal 530 and the late enable signal 532.

The early enable signal 530 and the late enable signal 532 can both last for a time duration that is less than a burst length of the bits of output data. Accordingly, the early enable signal 530 can envelope the leading bits of the output data (e.g., an early partition of the burst) and coordinate delivery of the leading bits for the even and odd pipelines. The late enable signal 532 can envelope the trailing bits of the output data (e.g., a late partition of the burst) and coordinate delivery of the trailing bits for the even and odd pipelines. For example, the early enable signal 530 can handle delivery of bits 0 to x of the output data, while the late enable signal 532 can handle delivery of bits x+1 to n of the output data. The value for n can represent an identifier or a bit number of the last bit (e.g., the least significant or the most significant bit) in the output data, and x can represent a value between 0 and n.

In some embodiments, the timing control circuit 195 can use the staggered enable signals to coordinate delivery of bits of output data even when a first command and second command are received with insufficient separation, e.g., the gapless burst scenario 402 of FIG. 4B. More details regarding the use of the staggered enable signals in the gapless burst scenario 402 or gapless switchover scenario are described below in relation to FIGS. 5C and 6C.

Figure 5C:
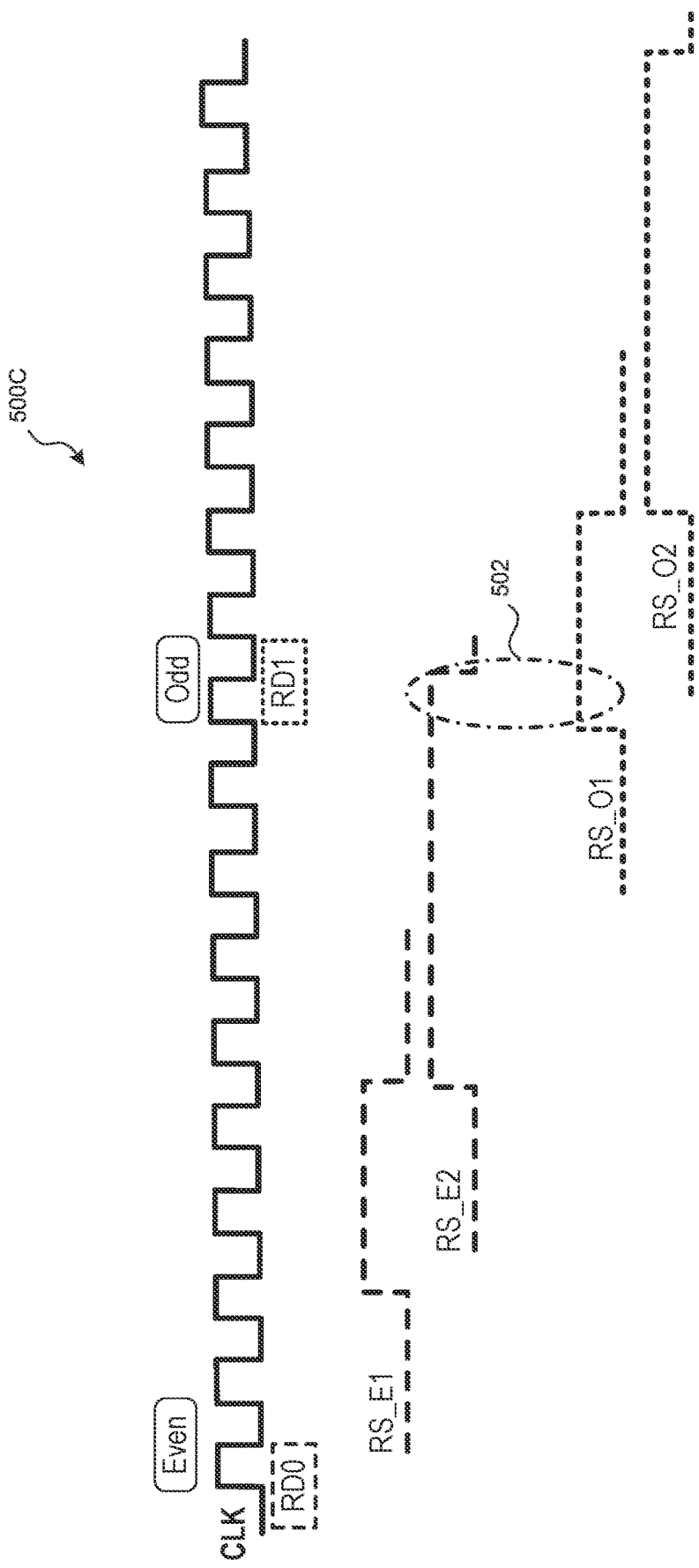
FIG. 5C illustrates a timing diagram of the staggered enable signals in accordance with an embodiment of the present technology.

FIG. 5C illustrates a timing diagram 500C of staggered enable signals in accordance with an embodiment of the present technology. In the timing diagram 500C, back-to-back commands can be received with insufficient separation (e.g., a duration less than a predetermined threshold). The command circuit 105 of FIG. 1 can receive a first command RD0 on an even clock pulse of the external clock CLK. In response, the RS circuit 190 can generate the early even enable signal RS_E1. The early even enable signal RS_E1 can flag/indicate that the first command RD0 begins with the even pipeline and DLL0 delivers a first bit of read data provided in response to the first command RD0 (e.g., a first read data). The early even enable signal RS_E1 can subsequently form an envelope around a burst of leading bits of the first read data and can be used to deliver the leading bits. The timing control circuit 195 can use the early even enable signal RS_E1 to coordinate delivery (with, e.g., the I/O circuit 160 of FIG. 1) of bits 0 to x of the first read data as described above. After generating the early enable signal, the RS circuit 190 can generate the late even enable signal RS_E2. The late even enable signal RS_E2 can form an envelope around a burst of trailing bits of the first read data and can be used to deliver the trailing bits. The timing control circuit 195 can deliver bits x+1 to n of the first read data using the late even enable signal RS_E2. For example, after the timing control circuit 195 delivers the leading 8 bits (e.g., bits 0 to 7) of the first read data using the early even enable signal RS_E1, the timing control circuit 195 can switch to using the late even enable signal RS_E2 to deliver the trailing 10 bits (e.g., bits 8 to 17) of the first read data.

The gapless scenario 502 can correspond to the command circuit 105 receiving a second command RD1 while the timing control circuit 195 is still using the late even enable signal RS_E2 to deliver trailing bits of the first read data. The second command RD1 can be received on an odd clock pulse of the external clock CLK. In response to receiving the second command RD1, the RS circuit 190 can generate the early odd enable signal RS_O1 and then the late odd enable signal RS_O2. The early and late odd enable signals can flag/indicate, envelop, and coordinate delivery for the corresponding aspects similarly as the even enable signals.

By using early enable signals and late enable signals for each of the first and second commands, the early even enable signal RS_E1 can prevent overlaps and conflicts with the early odd enable signal RS_O1. Similarly, the late even enable signal RS_E2 can prevent overlaps and conflicts with the late odd enable signal RS_O2. The early and late enable signals can ensure a time gap between the early enable signals RS_E1 and RS_O1, thereby ensuring the two early enable signals do not coexist at a same time. Accordingly, the timing control circuit 195 can ensure that the correct trailing bits of the first read data are delivered without conflicting/colliding with delivery of the leading bits of the second read data even for the gapless scenario 502. The overlap between the late even enable signal RS_E2 and the early odd enable signal RS_O1 do not disrupt the delivery since the early enable signals and late enable signals are separate enable signals used to handle different partitions of read data. For example, FF10 of circuit 502 can output RdClk180_E[4] for RD0 while FF11 of circuit 512 outputs RdClk180_O[0] for RD1. However, since RS_E1 is disabled and separate from RS_O1, the FF3 output from the circuit 502 can be disabled, thereby preventing any collisions at the merge circuit 518 for RdClk180[0]. Based on the staggered enable signals, the timing control circuit 195 can provide smooth transitions between two bursts of data and ensure correct data is delivered for the bursts without collisions or corruptions.

Figure 6A:
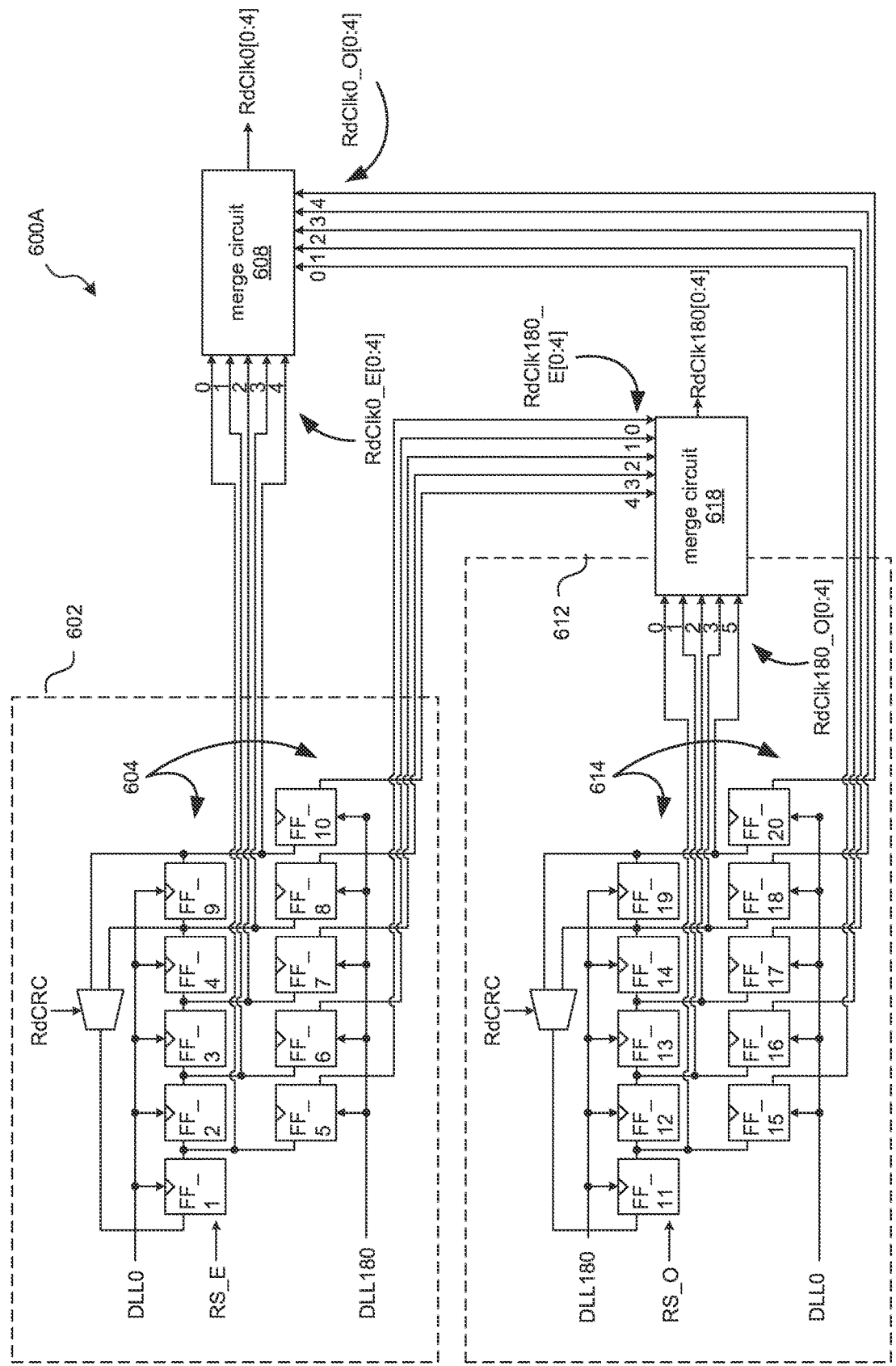
FIGS. 6A-6C illustrate the timing control circuit configured to use a chopping circuit in accordance with an embodiment of the present technology.
Figure 6B:
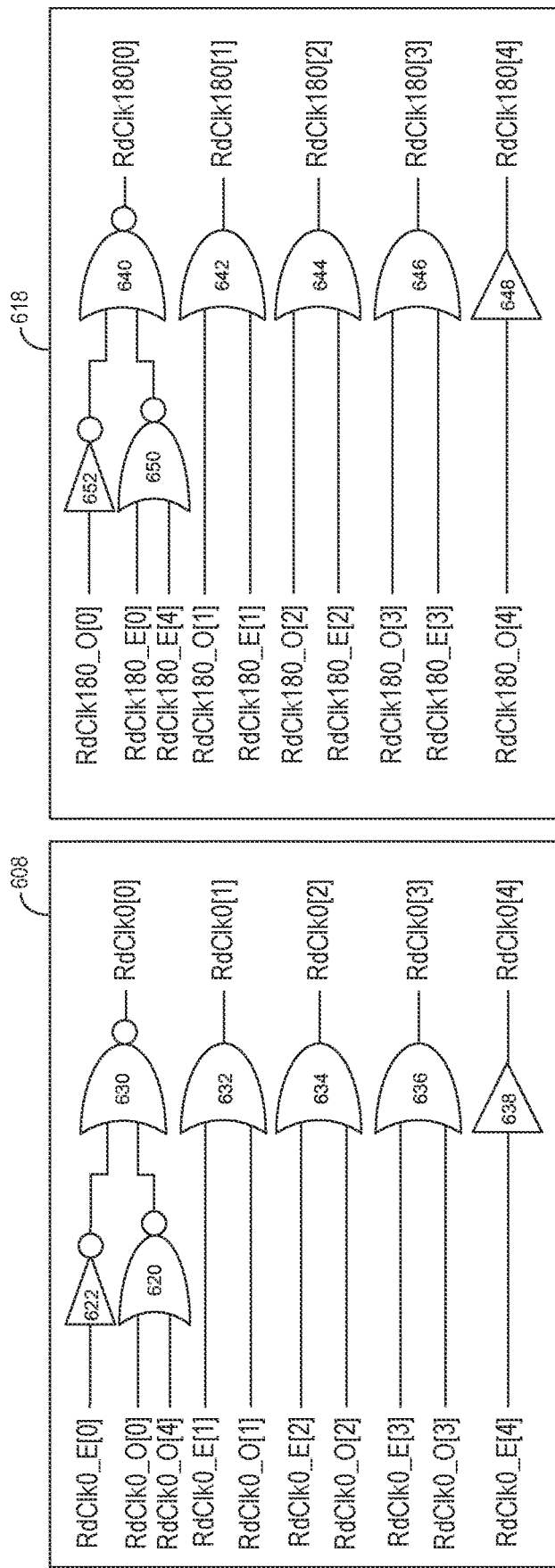
Figure 6C:
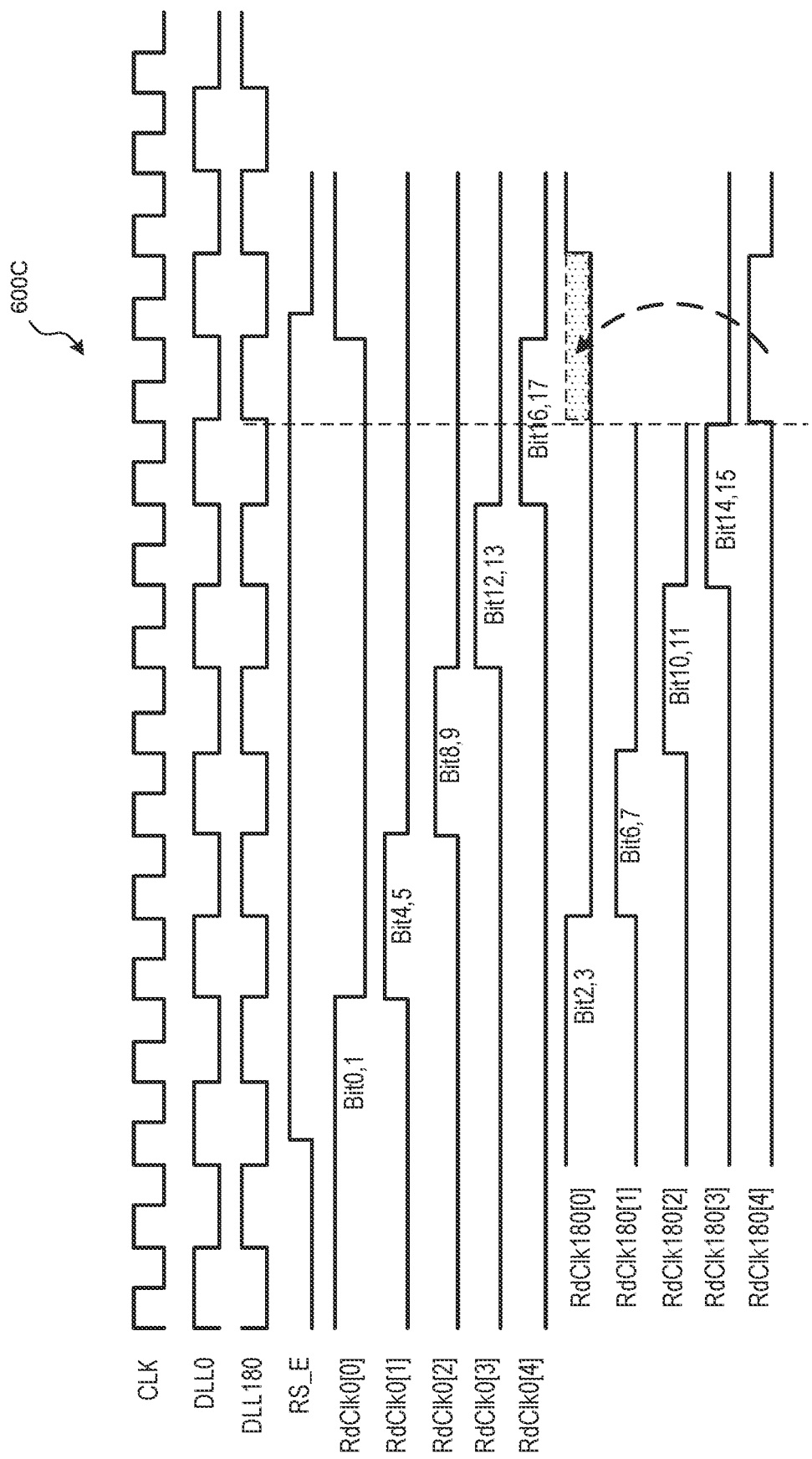

FIGS. 6A-6C illustrate the timing control circuit 195 of FIG. 1 configured to use a chopping circuit 600A in accordance with an embodiment of the present technology. FIG. 6A is a block diagram of the chopping circuit 600A in accordance with an embodiment of the present technology. The chopping circuit 600A can include an even circuit 602, a shift register 604, an odd circuit 612, and shift register 614 that correspond to or respectively match the even circuit 202, the shift register 204, the odd circuit 212, and the shift register 214 that are illustrated in FIG. 2. Accordingly, the sequences RdClk0_E[0:4], RdClk0_O[0:4], RdClk180_E[0:4], and RdClk180_O [0:4] can correspond to the sequences RdClk0_E[0:4], RdClk0_0[0:4], RdClk180_E[0:4], and RdClk180_O [0:4] that are illustrated in FIG. 2. The chopping circuit 600A can include a chopping merge circuit 608 and a chopping merge circuit 618.

FIG. 6B is a block diagram of the chopping merge circuit 608 and the chopping merge circuit 618 of FIG. 6A in accordance with an embodiment of the present technology. The chopping merge circuits 608 and 618 can include circuitry configured to combine the outputs from the even and odd circuits to generate a coordinating clock signal for the corresponding pipeline. For example, the chopping merge circuit 608 can include logic gates that combine RdClk0_E[0:4] and RdClk0_O[0:4] to generate RdClk0[0:4]. In some embodiments, each of the chopping merge circuits 608 and 618 can include a set of OR gates 632-636 and 642-646 that each receive corresponding coordination bits (e.g., RdClk bits 1-3) from the even and odd circuits. For the first clock bit, the chopping merge circuits 608 and 618 can include circuitry for analyzing/combining the first and last bits of separate or back-to-back commands. For example, the chopping merge circuit 608 can include:
an inverter or NOT gate 622 that outputs the logical negation of RdClk0_E[0],
a NOR gate 620 that outputs the logical NOR of RdClk0_O[0] and RdClk0_O[4], and
an OR gate 630 that outputs the logical OR of the output of the inverter 622 and the output of the NOR gate 620 as RdClk0[0].

Also, the chopping merge circuit 618 can include:
an inverter or NOT gate 652 that outputs the logical negation of RdClk180_O[0],
a NOR gate 650 that outputs the logical NOR of RdClk180_E[0] and RdClk180_E[4], and
an OR gate 640 that outputs the logical OR of the output of the inverter 652 and the output of the NOR gate 650 as RdClk180[0].

The chopping merge circuit 608 can include a buffer gate 638 that outputs RdClk0_E[4] as RdClk0[4], and the chopping merge circuit 618 can include a buffer gate 648 that outputs RdClk180_O[4] as RdClk180[4]. Accordingly, the merge circuits 608 and 618 can generate a repetitive pattern that is not divisible by 4 (e.g., where the combined length of RdClk0 and RdClk180 divided by four produces a non-zero remainder).

The circuit design (e.g., the number of gates) for the merge circuits 608 and 618 can depend on the number of flip-flops in the shift registers 604 and 614 (e.g., the number of bits in the output/combined data). For example, if the shift registers 604 and 614 each include n-stages of flip-flop circuits, then the merge circuits 608 and 618 can each be configured with at least n+2 gates.

FIG. 6C illustrates a timing diagram 600C of the chopping circuit 600A of FIG. 6A in accordance with an embodiment of the present technology. The illustrated example corresponds to receiving the command on an even clock pulse, and the RS circuit 190 can generate the even enable signal RS_E. The timing control circuit 195 of FIG. 1, configured with the chopping circuit 600A, can receive the even enable signal RS_E from the RS circuit 190. The chopping circuit 600A can then output RdClk0[0:4] and RdClk180[0:4] as sequences of the internal clock signals DLL0 and DLL180, respectively. The timing control circuit 195 can use the sequence RdClk0[0:4] to deliver bits 0-1, 4-5, 8-9, 12-13, and 16-17 of read data provided by the received command. The timing control circuit 195 can use the sequence RdClk180[0:4] to deliver the bits 2-3, 6-7, 10-11, and 14-15 of the read data provided by the received command.

The read data and/or the corresponding sequence of RdClk0[0:4] combined with RdClk180[0:4] can have lengths not divisible by 4 (e.g., when the read data includes cyclic redundancy check data) where a remainder of dividing the total number of output bits of the read data may be a positive/non-zero integer. The chopping circuit 600A (via, e.g., the chopping merge circuits) can remove the clock pulses of the sequence RdClk180[4], used to deliver the last bits of the read data corresponding to the remainder (e.g., the remainder bits), and append them before the clock pulses of the sequence RdClk180[0] of a next command. In other words, the chopping circuit 600A can stop or "chop" the bursts of the remainder bits internally and apply them as the leading bursts of the next command. For example, when a length of output data is 18 bits long, the chopping circuit 600A can use the logic gates for the first and/or last bits in the chopping merge circuits to stop the bursts of the 19th and 20th bits of the output data and apply the bursts as the 1st and 2nd bits of a next read command.

In some embodiments, the timing control circuit 195 can use the chopping circuit 600A to coordinate delivery of output data when a first command and second command are received with insufficient separation, e.g., the gapless burst scenario 402 of timing diagram 400B in FIG. 4B. Since the burst of the trailing bits of the output data provided by the first command (e.g., a first read data) are stopped or "chopped" and applied as the leading bursts of the second command, delivery of the trailing bits of the first read data no longer conflict with delivery of the leading bits of output data provided by the second command (e.g., a second read data). In other words, using the chopping circuit 600A, the timing control circuit 195 can ensure a separation between the delivery of the trailing bits of a current read command and the delivery of the leading bits of a next read command. Accordingly, the timing control circuit 195 can handle the even and odd enable signals in the gapless burst scenario 402 and ensure timely and error-free delivery of bits of the output data.

Figure 6D:
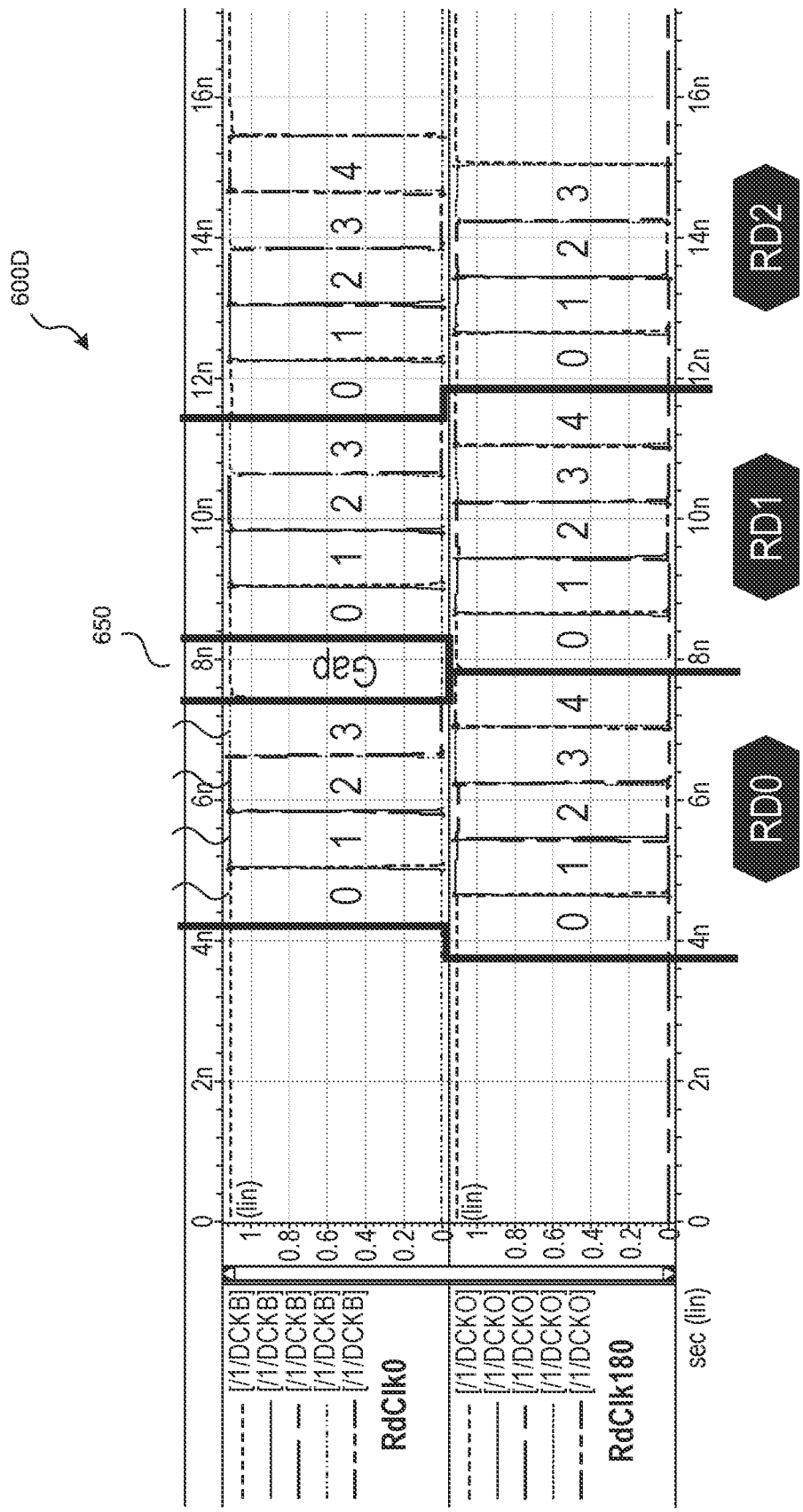
FIG. 6D illustrates a timing diagram of the chopping circuit in accordance with an embodiment of the present technology.

FIG. 6D illustrates a timing diagram 600D of the chopping circuit 600A of FIG. 6A in accordance with an embodiment of the present technology. The illustrated example corresponds to receiving a first command RD0 on an odd clock pulse, a second command RD1 on an odd clock pulse, and a third command RD2 on an even clock pulse. The chopping circuit 600A can output RdClk0[0:4] and RdClk180[0:4] as output sequences of the internal clock signals DLL0 and DLL180, respectively, for each of the three read commands. The timing control circuit 195 can use the sequence RdClk180[0:4] to coordinate output of bits 0-1, 4-5, 8-9, 12-13, and 16-17 and the sequence RdClk0[0:3] to coordinate output of the bits 2-3, 6-7, 10-11, and 14-15 of read data (e.g., first and second read data) provided by the first and second received commands. The timing control circuit 195 can use the sequence RdClk0[0:4] to coordinate output of bits 0-1, 4-5, 8-9, 12-13, and 16-17 and the sequence RdClk180[0:3] to deliver the bits 2-3, 6-7, 10-11, and 14-15 of read data (e.g., third read data) provided by the third received command.

When cyclic redundancy check is enabled in the timing diagram 600D, the read data and/or the corresponding output sequence of RdClk0[0:4] combined with RdClk180[0:4] of the first command RD0 can have a length not divisible by 4 (e.g., 5-7 bits, 9-11 bits, 17-19 bits, etc.). For example, the delivery of first and second read data can be coordinated using RdClk180[0:4] and RdClk0[0:3]. Also, the delivery of the third read data can be coordinated using RdClk0[0:4] and RdClk180[0:3]. Accordingly, the chopping merge circuits 608 and 618 can effectively create a processing cycle that corresponds to the maximum length that is non-divisible by 4.

As an illustrative example, when two sequential or back-to-back signals are both received on the same even/odd pulse (e.g., even and even or odd and odd), the corresponding processing cycles can form a gap 650 where the clock pulse RdClk0[4] can remain unused for coordinating output of bits of the first read data. Since the same even/odd circuit (e.g., phase shifter) may be used to generate both (1) the end of a preceding clock sequence for the first read data and (2) the beginning of a subsequent clock sequence for the second read data, the resulting sequences will be sequential and not overlapped.

Alternatively, when two sequential or back-to-back signals are received on different clock pulses (e.g., even and odd or odd and even), the corresponding coordination outputs may overlap. During the overlapped period, outputs of both coordination circuits may be active. The chopping merge circuit 608 and 610 can include the additional logic for bit[0] and/or bit[4] to account for the overlap as described above. Proceeding to the second command RD1, the chopping circuit 600A can remove or ignore RdClk0[4] for the second command RD1 and separately output RdClk0[0] of the third command RD2 while concurrently outputting RdClk180[4]. By chopping off or stopping the last clock cycle RdClk0[4] of the second command RD1 and coordinating the selection of RdClk0[0], the chopping circuit 600A can save the last clock cycle and instead give that time to RdClk0[0] of the third command RD2. Accordingly, the chopping circuit 600A can shorten the duration needed to coordinate output of the bits of the second read data (e.g., only 9 clock pulses exist between the second command RD1 and the third command RD2).

Figure 7:
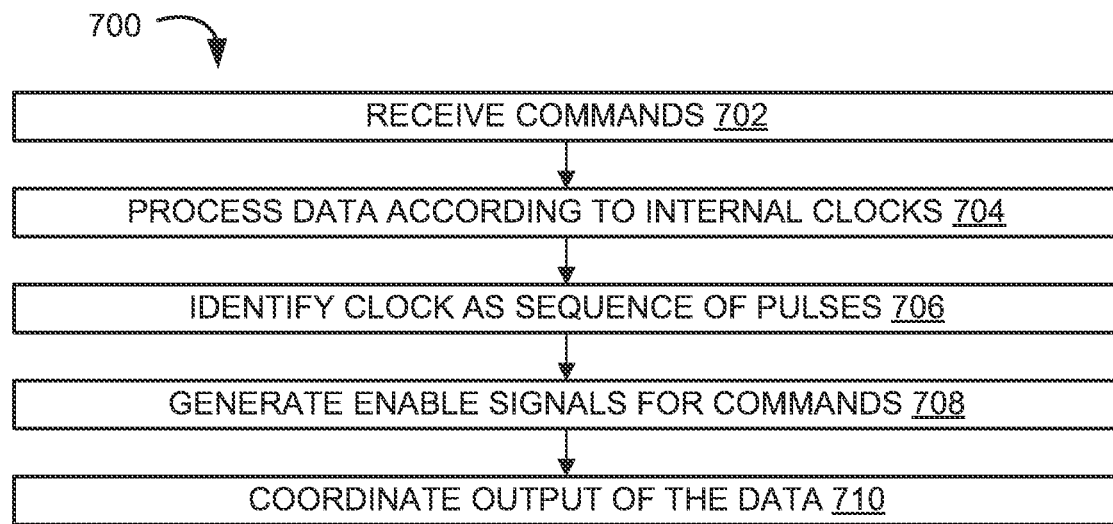
FIG. 7 is a flow diagram illustrating an example method of operating an apparatus in accordance with an embodiment of the present technology.

FIG. 7 is a flow diagram illustrating an example method 700 of operating an apparatus (e.g., the apparatus 100 of FIG. 1) in accordance with an embodiment of the present technology. The method 700 can be for implementing the command/address input circuit, input/output circuit, clock input circuit, RS circuit, and/or timing control circuit described above. Also, the method 700 can be for implementing any of the timing diagrams described above (e.g., the timing diagrams 300B-300C of FIGS. 3B-3C, the timing diagrams 500B-500C of FIGS. 5B-5C, and/or the timing diagrams 600C-600D of FIGS. 6C-6D).

At block 702, the apparatus 100 can receive commands from an external device. The received commands can be read commands issued by the external device to request data from the apparatus 100. In some embodiments, the apparatus 100 can implement N pipelines that each process 1/N portion of the data. For example, the apparatus 100 can implement two pipelines (e.g., an even pipeline and an odd pipeline) that each process ½ portion of the data.

At block 704, the apparatus 100 can process the stored data according to internal clocks. The apparatus 100 can process each 1/N portion of the stored data according to a corresponding internal clock. The corresponding internal clock can have an internal frequency that is 1/N of the external frequency of the external clock. For example, when N=2, the apparatus 100 can process alternating portions of the data according to an even internal clock (e.g., DLL0) and an odd internal clock (e.g., DLL180) that each have a frequency that is ½ the external frequency.

At block 706, the apparatus 100 can identify the external clock as a sequence of N number of clock pulses. Each pulse in the sequence can correspond to one of the N number of pipelines of processing data according to the received commands. For example, when N=2 (e.g., 2 pipelines, the even pipeline and the odd pipeline), the apparatus 100 can identify the external clock as a sequence of 2 clock pulses or alternating even and odd pulses. The even pulses can be aligned with the even internal clock and the odd pulses can be aligned with the odd internal clock.

At block 708, the apparatus 100 can generate enable signals for the commands. The apparatus 100 can generate one or more enable signals for each received command. The one or more enable signals can represent a time the corresponding command is received according to the position in the sequence of N number of pulses of the external clock. For example, when N=2, the apparatus 100 can generate one or more enable signals for representing whether the command is received on an odd pulse or an even pulse of the external clock. In some embodiments, the one or more enable signals can include an even enable signal and an odd enable signal. In various embodiments, the one or more enable signals can include an early even enable signal followed by a late even enable signal, and/or an early odd enable signal followed by a late odd enable signal. The early even enable signal can be offset in time from the late even enable signal. The early odd enable signal can be offset in time from the late odd enable signal.

At block 710, the apparatus 100 can coordinate output of the stored data. The apparatus 100 can coordinate an output sequence (e.g., the combination of RdClk0 and RdClk180) used to combine outputs from the N number of pipelines to correspond to the data. The output sequence can include a sequence of clock signal elements/pulses generated by the timing control circuit as described above (e.g., the merge circuits of the timing control circuit). The output sequence can be controlled according to the one or more enable signals to coordinate output of the data. As an example, the apparatus 100 can receive a first command followed by a second command with minimum separation. The apparatus 100 can separate in time a first output sequence and a second output sequence that respectively correspond to the first received command and the second received command. The first output sequence can be used to coordinate output of a first read data provided in response to the first command. The second output sequence can be used to coordinate output of a second read data provided in response to the second command. When the first command and the second command are separated by an odd number of clock pulses of the external clock, the apparatus 100 can maintain a separation between the first read data and the second read data.

In some embodiments, the apparatus 100 can maintain the separation using the one or more enable signals. When the first and second commands are received on the even and odd cycles, respectively, the apparatus 100 can use the early even enable signal to control one or more leading clock signal elements/pulses of the first output sequence and coordinate output of one or more leading bits of the first read data. The apparatus 100 can use the late even enable signal to control one or more trailing clock signal elements/pulses of the first output sequence and coordinate output of one or more trailing bits of the first read data. The apparatus 100 can then use the early odd enable signal to control one or more leading clock signal elements/pulses of the second output sequence and coordinate output of one or more leading bits of the second read data. The apparatus 100 can use the late odd enable signal to control one or more trailing clock signal elements/pulses of the second output sequence and coordinate output of one or more trailing bits of the second read data. When the first and second commands are received on the odd and even cycles, respectively, the apparatus 100 can similarly use the set of staggered odd enable signals to control the first output sequence and the set of staggered even enable signals to control the second output sequence.

In various embodiments, the apparatus 100 can maintain the separation using the chopping circuit described above. The chopping circuit can remove one or more trailing pulses of the first output sequence. After removing the trailing pulses, the chopping circuit can append the one or more trailing pulses of the first output sequence before one or more leading pulses of the second output sequence.

Figure 8:
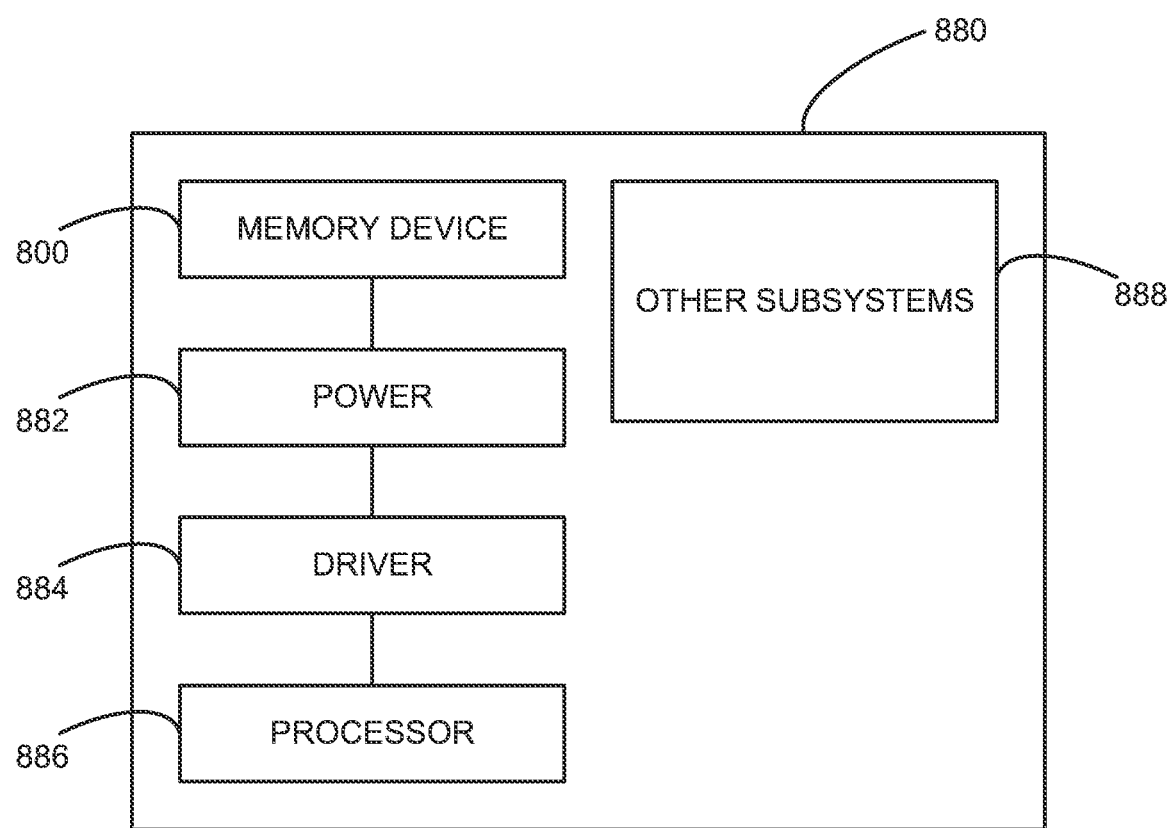
FIG. 8 is a schematic view of a system that includes an apparatus in accordance with embodiments of the present technology.

FIG. 8 is a schematic view of a system that includes an apparatus in accordance with embodiments of the present technology. Any one of the foregoing apparatuses (e.g., memory devices) described above with reference to FIGS. 1-7 can be incorporated into or implemented in memory (e.g., a memory device 800) or any of a myriad of larger and/or more complex systems, a representative example of which is system 880 shown schematically in FIG. 8. The system 880 can include the memory device 800, a power source 882, a driver 884, a processor 886, and/or other subsystems or components 888. The memory device 800 can include features generally similar to those of the apparatus described above with reference to FIGS. 1-7 and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-6.

We claim:

1. An apparatus, comprising:
    an external clock circuit configured to receive an external clock having an external frequency, wherein the external clock is shared with an external device;
    a command circuit coupled to the external clock circuit and configured to receive commands from the external device;
    a set of N pipelines configured to process a data unit, wherein each of the N pipelines is configured to process a unique portion of the data unit according to a channel-specific internal clock that is lower than the external clock, wherein N is greater than 1;
    a read-state circuit coupled to the external clock circuit and the command circuit, the read-state circuit configured to:
        identify the external clock as a sequence of alternating N number of pulses; and
        generate one or more enable signals for representing a unique pulse of the N number of pulses a command is received on; and
    a timing control circuit coupled to the read-state circuit and the set of N pipelines, the timing control circuit configured to:

maintain a separation in time between a first output sequence and a second output sequence that respectively correspond to a first received command and a second received command when the second received command follows the first received command.

2. The apparatus of claim 1, wherein the one or more enable signals comprises an early even enable signal followed by a late even enable signal and/or an early odd enable signal followed by a late odd enable signal.

3. The apparatus of claim 2, wherein the timing control circuit is configured to:
using the early even enable signal, coordinate output of one or more leading bits of a first read data;
using the late even enable signal, coordinate output of one or more trailing bits of the first read data;
using the early odd enable signal, coordinate output of one or more leading bits of a second read data, wherein the early odd enable signal is offset from the early even enable signal; and
using the late odd enable signal, coordinate output of one or more trailing bits of the second read data, wherein the late odd enable signal is offset from the late even enable signal.

4. The apparatus of claim 1, wherein:
the set of N pipelines includes an even pipeline and an odd pipeline where N=2, wherein the even and odd pipelines are configured to process alternating portions of a stored unit of data according to an even internal clock and an odd internal clock, respectively,
the first read command is received on an even pulse of the N number of pulses, wherein even pulses of the N number of pulses are aligned with the even internal clock,
the second read command is received on an odd pulse of the N number of pulses, wherein odd pulses of the N number of pulses are aligned with the odd internal clock,
a first bit of a first read data is outputted to the external device according to the even internal clock, and
a first bit of the second read data is outputted to the external device according to the odd internal clock.

5. The apparatus of claim 1, wherein the timing control circuit is configured to:
remove one or more trailing pulses of the first output sequence; and
append the one or more trailing pulses of the first output sequence before one or more leading pulses of the second output sequence.

6. The apparatus of claim 5, wherein:
a first read data includes cyclic redundancy check data, and
the first read data and the first output sequence have lengths that are not divisible by four.

7. The apparatus of claim 6, wherein:
the first read data includes 6, 10, or 18 bits, and
the cyclic redundancy check data corresponds to 2 bits out of the 6, 10, or 18 bits of the first read data.

8. The apparatus of claim 1, wherein:
the apparatus comprises a memory device;
the timing control circuit is configured to: maintain the separation between a first read data and a second read data that are provided in response to the first read command and the second read command, respectively, when the first and second read commands are separated by an odd number of clock pulses of the external clock.

9. A system comprising:
a set of N pipelines configured to process a data unit, wherein each of the N pipelines is configured to process a unique portion of the data unit according to a channel-specific internal clock that is lower than an external clock, wherein N is greater than 1;
a processing-state circuit configured to identify a received time of a received command, wherein the external clock is tracked as a sequence of N segments that each corresponds to a unique one of the N pipelines, and wherein the received time is identified according to a position in the sequence of N segments; and
a timing control circuit coupled to the processing-state circuit and the set of N pipelines, the timing control circuit configured to maintain a separation in time between a first sequence and a second sequence that respectively correspond to a first received command and a second received command when the second received command follows the first received command.

10. The system of claim 9, wherein the timing control circuit is configured to determine a sequence for combining outputs from the N pipelines, wherein the sequence is determined based on the identified received time.

11. The system of claim 10, wherein:
the set of N pipelines includes an even pipeline and an odd pipeline where N=2, wherein the even and odd pipelines are configured to process alternating portions of a stored unit of data according to an even internal clock and an odd internal clock, respectively;
the processing-state circuit is configured to:
identify the external clock as a sequence of alternating even and odd segments, wherein the even segments are aligned with the even internal clock and the odd segments are aligned with the odd internal clock; and
generate one or more enable signals for representing whether the received command is received on an odd segment or an even segment of the external clock; and
the timing control circuit is configured to maintain the separation between a first read data and a second read data that are provided in response to the first read command and the second read command, respectively, when the first and second read commands are separated by an odd number of clock segments for the external clock.

12. The system of claim 11, wherein the one or more enable signals comprises an early even enable signal followed by a late even enable signal, and/or an early odd enable signal followed by a late odd enable signal.

13. The system of claim 12, wherein the timing control circuit is configured to:
using the early odd enable signal, coordinate output of one or more leading bits of the first read data;
using the late odd enable signal, coordinate output of one or more trailing bits of the first read data;
using the early even enable signal, coordinate output of one or more leading bits of the second read data, wherein the early even enable signal is offset from the early odd enable signal; and
using the late even enable signal, coordinate output of one or more trailing bits of the second read data, wherein the late even enable signal is offset from the late odd enable signal.

14. A method comprising:
processing, by a memory device, a unique portion of a data unit according to a channel-specific internal clock that is lower than an external clock;

identifying, by the memory device, a received time of a received command according to a position in a sequence of N number of pulses; and maintaining, by the memory device, a separation in time between a first output sequence and a second output sequence that respectively correspond to a first received command and a second received command when the second received command follows the first received command.

15. The method of claim 14, further comprising:
determining, by the memory device, a sequence for combining outputs from N pipelines, wherein the sequence is determined based on the identified received time.

16. The method of claim 15, further comprising:
processing alternating portions of a stored unit of data according to an even internal clock and an odd internal clock, wherein N=2;

identifying the external clock as a sequence of alternating even and odd pulses, wherein the even pulses are aligned with the even internal clock and the odd pulses are aligned with the odd internal clock;

generating one or more enable signals for representing whether the received command is received on an odd pulse or an even pulse of the external clock; and maintaining the separation between a first read data and a second read data that are provided in response to the first read command and the second read command, respectively, when the first and second read commands are separated by an odd number of clock pulses for the external clock.

17. The method of claim 16, further comprising:
removing one or more trailing pulses of the first output sequence; and appending the one or more trailing pulses of the first output sequence before one or more leading pulses of the second output sequence.

18. The method of claim 17, wherein:
the first read data includes cyclic redundancy check data, and the first read data and the first output sequence have lengths that are not divisible by four.

19. The method of claim 16, wherein the one or more enable signals comprises an early even enable signal followed by a late even enable signal, and/or an early odd enable signal followed by a late odd enable signal.

20. The method of claim 19, further comprising:
using the early odd enable signal, coordinating output of one or more leading bits of the first read data;

using the late odd enable signal, coordinating output of one or more trailing bits of the first read data;

using the early even enable signal, coordinating output of one or more leading bits of the second read data, wherein the early even enable signal is offset from the early odd enable signal; and using the late even enable signal, coordinating output of one or more trailing bits of the second read data, wherein the late even enable signal is offset from the late odd enable signal.

* * * * *